(12) United States Patent
Feng et al.

(10) Patent No.: US 11,263,953 B2
(45) Date of Patent: Mar. 1, 2022

(54) SHIFT REGISTER UNIT AND DRIVE METHOD THEREOF, GATE DRIVE CIRCUIT AND DISPLAY DEVICE

(71) Applicants: Hefei Xinsheng Optoelectronics Technology Co., Ltd., Hefei (CN); BOE Technology Group Co., Ltd., Beijing (CN)

(72) Inventors: Xuehuan Feng, Beijing (CN); Yongqian Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 213 days.

(21) Appl. No.: 16/616,348

(22) PCT Filed: May 8, 2019

(86) PCT No.: PCT/CN2019/086045
§ 371 (c)(1),
(2) Date: Nov. 22, 2019

(87) PCT Pub. No.: WO2020/024641
PCT Pub. Date: Feb. 6, 2020

(65) Prior Publication Data
US 2021/0335202 A1    Oct. 28, 2021

(30) Foreign Application Priority Data
Aug. 1, 2018   (CN) .......................... 201810863579.2

(51) Int. Cl.
*G09G 3/20*      (2006.01)
*G11C 19/28*      (2006.01)

(52) U.S. Cl.
CPC .......... *G09G 3/2092* (2013.01); *G11C 19/28* (2013.01); *G09G 2300/0426* (2013.01);
(Continued)

(58) Field of Classification Search
CPC .......... G11C 19/28; G09G 2310/0286; G09G 3/2092
See application file for complete search history.

(56) References Cited

U.S. PATENT DOCUMENTS 6,556,646 B1   4/2003   Yeo et al.
9,501,989 B2   11/2016   Xiao
(Continued)

FOREIGN PATENT DOCUMENTS

CN    103928009 A    7/2014
CN    104167192 A    11/2014
(Continued)

OTHER PUBLICATIONS

Sep. 2, 2019—(CN) First Office Action Appn 201810863579.2 with English Translation.
(Continued)

*Primary Examiner* — Xuemei Zheng
(74) *Attorney, Agent, or Firm* — Banner & Witcott, Ltd.

(57) ABSTRACT

A shift register unit and a drive method thereof, a gate drive circuit, and a display device are provided. A shift register unit includes a first noise reduction circuit, a first input circuit, and an output circuit; the first input circuit is coupled to a first node, and is configured to input a first control signal to the first node in response to a first input signal; the output circuit is coupled to the first node and an output terminal, and is configured to output a first output signal to the output terminal under control of a level of the first node; and the first noise reduction circuit is coupled to the output terminal,
(Continued)

and is configured to perform noise reduction on the output terminal in response to a level of the output terminal.

20 Claims, 11 Drawing Sheets

(52) U.S. Cl.
CPC .............. *G09G 2310/0286* (2013.01); *G09G 2310/061* (2013.01); *G09G 2310/08* (2013.01); *G09G 2320/045* (2013.01)

(56) References Cited

U.S. PATENT DOCUMENTS

| | | |
|---|---|---|
| 9,824,659 B2 | 11/2017 | Gu et al. |
| 10,121,436 B2 | 11/2018 | Huang et al. |
| 10,170,069 B2 | 1/2019 | Xue et al. |
| 10,332,470 B2 | 6/2019 | Feng et al. |
| 2017/0162122 A1 | 6/2017 | In |
| 2017/0193885 A1* | 7/2017 | Feng .................... G11C 19/184 |
| 2020/0258464 A1* | 8/2020 | Wang .................. H04M 1/0266 |
| 2021/0209993 A1* | 7/2021 | Sun ....................... G09G 3/2092 |

FOREIGN PATENT DOCUMENTS

| | | | |
|---|---|---|---|
| CN | 104700803 | A | 6/2015 |
| CN | 105047168 | A | 11/2015 |
| CN | 106157923 | A | 11/2016 |
| CN | 106486082 | A | 3/2017 |
| CN | 106683632 | A | 5/2017 |
| CN | 106683634 | A | 5/2017 |
| CN | 107527587 | A | 12/2017 |
| CN | 108281123 | A | 7/2018 |
| CN | 108648718 | A | 10/2018 |
| KR | 20140133033 | A | 11/2014 |
| KR | 20170078978 | A | 7/2017 |

OTHER PUBLICATIONS

Mar. 1, 2020—(CN) Second Office Action Appn 201810863579.2 with English Translation.

* cited by examiner

SHIFT REGISTER UNIT AND DRIVE METHOD THEREOF, GATE DRIVE CIRCUIT AND DISPLAY DEVICE

CROSS-REFERENCE TO RELATED APPLICATION

The application is a U.S. National Phase Entry of International Application No. PCT/CN2019/086045 filed on May 8, 2019, designating the United States of America and claiming priority to Chinese Patent Application No. 201810863579.2, filed on Aug. 1, 2018. The present application claims priority to and the benefit of the above-identified applications and the above-identified applications are incorporated by reference herein in their entirety.

TECHNICAL FIELD

Embodiments of the present disclosure relate to a shift register unit and a drive method thereof, a gate drive circuit, and a display device.

BACKGROUND

In a field of display technology, a display panel, such as a liquid crystal display (LCD) or an organic light emitting diode (OLED) display panel, includes a plurality of gate lines. The plurality of gate lines can be driven by a gate drive circuit. The gate drive circuit is usually integrated in a Gate IC (integrated circuit). With the rapid development of the display technology, display panels are increasingly developing towards high integration and low cost. In the design of the Gate IC, a chip area is a main factor affecting a chip cost. How to effectively reduce the chip area is a problem that technical developers need to consider emphatically.

SUMMARY

At least some embodiments of the present disclosure provide a shift register unit, which includes a first noise reduction circuit, a first input circuit, and an output circuit; the first input circuit is coupled to a first node, and is configured to input a first control signal to the first node in response to a first input signal; the output circuit is coupled to the first node and an output terminal, and is configured to output a first output signal to the output terminal under control of a level of the first node; and the first noise reduction circuit is coupled to the output terminal, and is configured to perform noise reduction on the output terminal in response to a level of the output terminal.

For example, in the shift register unit provided by some embodiments of the present disclosure, the first noise reduction circuit includes a first noise reduction transistor, and the output terminal includes a first signal output terminal, a gate electrode of the first noise reduction transistor and a first electrode of the first noise reduction transistor are both coupled to the first signal output terminal, a second electrode of the first noise reduction transistor is coupled to the first node to receive a level signal of the first node, and the first noise reduction transistor is configured to, in response to a level of the first signal output terminal, perform noise reduction on the first signal output terminal using the level signal of the first node; or a gate electrode of the first noise reduction transistor and a first electrode of the first noise reduction transistor are both coupled to the first signal output terminal, a second electrode of the first noise reduction transistor is coupled to an output clock signal terminal to receive an output clock signal, and the first noise reduction transistor is configured to, in response to a level of the first signal output terminal, perform noise reduction on the first signal output terminal using the output clock signal.

For example, in the shift register unit provided by some embodiments of the present disclosure, the output circuit further includes a first output transistor; a gate electrode of the first output transistor is coupled to the first node, a first electrode of the first output transistor is configured to be coupled to the output clock signal terminal to receive the output clock signal, and a second electrode of the first output transistor is coupled to the first signal output terminal; and the output clock signal is transmitted to the first signal output terminal via the first output transistor and serves as a first sub-output signal, and the first output signal includes the first sub-output signal.

For example, in the shift register unit provided by some embodiments of the present disclosure, the first noise reduction circuit further includes a second noise reduction transistor, and the output terminal further includes a second signal output terminal, a gate electrode of the second noise reduction transistor and a first electrode of the second noise reduction transistor are both coupled to the second signal output terminal, a second electrode of the second noise reduction transistor is coupled to the first node to receive the level signal of the first node, and the second noise reduction transistor is configured to, in response to a level of the second signal output terminal, perform noise reduction on the second signal output terminal using the level signal of the first node; or a gate electrode of the second noise reduction transistor and a first electrode of the second noise reduction transistor are both coupled to the second signal output terminal, a second electrode of the second noise reduction transistor is coupled to the output clock signal terminal to receive the output clock signal, and the second noise reduction transistor is configured to, in response to the level of the second signal output terminal, perform noise reduction on the second signal output terminal using the output clock signal.

For example, in the shift register unit provided by some embodiments of the present disclosure, the output circuit further includes a second output transistor and a first capacitor, a gate electrode of the second output transistor is coupled to the first node, a first electrode of the second output transistor is configured to be coupled to the output clock signal terminal to receive the output clock signal, and a second electrode of the second output transistor is coupled to the second signal output terminal; a first electrode of the first capacitor is configured to be coupled to the first node, and a second electrode of the first capacitor is configured to be coupled to the second electrode of the second output transistor; and the output clock signal is transmitted to the second signal output terminal via the second output transistor and serves as a second sub-output signal, and the first output signal includes the second sub-output signal.

For example, the shift register unit provided by some embodiments of the present disclosure further includes a second input circuit; the second input circuit is coupled to the first node, and is configured to input a second control signal to the first node according to a second input signal; and the output circuit is further configured to output a second output signal to the output terminal under control of the level of the first node.

For example, the shift register unit provided by some embodiments of the present disclosure also comprises a control node, the second input circuit includes a charging sub-circuit, a storage sub-circuit, and an isolation sub-circuit, the charging sub-circuit is coupled to the control node, and is configured to input the second input signal to the control node in response to a second clock signal; the storage sub-circuit is coupled to the control node, and is configured to store the second input signal input by the charging sub-circuit; and the isolation sub-circuit is coupled to the control node and the first node, and is configured to input the second control signal to the first node under control of a level of the control node and a first clock signal.

For example, in the shift register unit provided by some embodiments of the present disclosure, the first input circuit includes a first transistor; a gate electrode of the first transistor is configured to be coupled to a first input signal terminal to receive the first input signal, a first electrode of the first transistor is configured to be coupled to a second voltage terminal to receive a second voltage, the first control signal includes the second voltage, and a second electrode of the first transistor is configured to be coupled to the first node.

For example, the shift register unit provided by some embodiments of the present disclosure further includes a second noise reduction circuit, the second noise reduction circuit is coupled to the first node, a second node and the output terminal, and is configured to simultaneously perform noise reduction on the first node and the output terminal under control of a level of the second node.

For example, in the shift register unit provided by some embodiments of the present disclosure, the output circuit includes a first signal output terminal and a second signal output terminal, and the second noise reduction circuit includes a second transistor, a third transistor, and a fourth transistor; a gate electrode of the second transistor is coupled to the second node, a first electrode of the second transistor is coupled to the first node, and a second electrode of the second transistor is configured to be coupled to a first voltage terminal to receive a first voltage; a gate electrode of the third transistor is coupled to the second node, a first electrode of the third transistor is coupled to the first signal output terminal, and a second electrode of the third transistor is configured to be coupled to a third voltage terminal to receive a third voltage; and a gate electrode of the fourth transistor is coupled to the second node, a first electrode of the fourth transistor is coupled to the second signal output terminal, and a second electrode of the fourth transistor is configured to be coupled to the first voltage terminal to receive the first voltage.

For example, the shift register unit provided by some embodiments of the present disclosure further includes a first control circuit, the first control circuit is coupled to the first node and a second node, and is configured to control a level of the second node under control of the level of the first node.

For example, the shift register unit provided by some embodiments of the present disclosure further includes a second control circuit, the second control circuit is coupled to a second node, and is configured to control a level of the second node in response to a third control signal.

For example, the shift register unit provided by some embodiments of the present disclosure further includes a third control circuit, the third control circuit is coupled to a second node, and is configured to control a level of the second node in response to a fourth control signal.

For example, the shift register unit provided by some embodiments of the present disclosure further includes a first reset circuit, the first reset circuit is coupled to the first node, and is configured to reset the first node in response to a first reset control signal.

For example, the shift register unit provided by some embodiments of the present disclosure further includes a second reset circuit, the second reset circuit is coupled to the first node, and is configured to reset the first node in response to a second reset control signal.

For example, the shift register unit provided by some embodiments of the present disclosure further includes a second input circuit, a second noise reduction circuit, a first control circuit, a second control circuit, a third control circuit, a first reset circuit, and a second reset circuit; the first input circuit includes a first transistor, a gate electrode of the first transistor is configured to be coupled to a first input signal terminal to receive the first input signal, a first electrode of the first transistor is configured to be coupled to a second voltage terminal to receive a second voltage, the first control signal includes the second voltage, and a second electrode of the first transistor is coupled to the first node; the second noise reduction circuit includes a second transistor, a third transistor, and a fourth transistor, the output circuit includes a first signal output terminal and a second signal output terminal, a gate electrode of the second transistor is coupled to a second node, a first electrode of the second transistor is coupled to the first node, and a second electrode of the second transistor is configured to be coupled to a first voltage terminal to receive a first voltage; a gate electrode of the third transistor is coupled to the second node, a first electrode of the third transistor is coupled to the first signal output terminal, and a second electrode of the third transistor is configured to be coupled to a third voltage terminal to receive a third voltage; and a gate electrode of the fourth transistor is coupled to the second node, a first electrode of the fourth transistor is coupled to the second signal output terminal, and a second electrode of the fourth transistor is configured to be coupled to the first voltage terminal to receive the first voltage; the second input circuit includes a charging sub-circuit, a storage sub-circuit, and an isolation sub-circuit, the charging sub-circuit includes a fifth transistor, a gate electrode of the fifth transistor is configured to receive a second clock signal, a first electrode of the fifth transistor is configured to receive a second input signal, a second electrode of the fifth transistor is coupled to a control node, the storage sub-circuit includes a second capacitor, a first electrode of the second capacitor is coupled to the control node, a second electrode of the second capacitor is configured to be coupled to the first voltage terminal to receive the first voltage, the isolation sub-circuit includes a sixth transistor and a seventh transistor, a gate electrode of the sixth transistor is coupled to the control node, a first electrode of the sixth transistor is configured to receive a second control signal, a second electrode of the sixth transistor is coupled to a first electrode of the seventh transistor, a gate electrode of the seventh transistor is configured to receive a first clock signal, and a second electrode of the seventh transistor is coupled to the first node; the first control circuit includes an eighth transistor, a ninth transistor, and a tenth transistor, a gate electrode of the eighth transistor is coupled to a first electrode of the eighth transistor, and is configured to be coupled to a fourth voltage terminal to receive a fourth voltage, a second electrode of the eighth transistor is coupled to the second node, a gate electrode of the ninth transistor is coupled to a first electrode of the ninth transistor, and is configured to be coupled to a fifth voltage terminal to receive a fifth voltage, and a second electrode of the ninth transistor is coupled to the second node; a gate electrode of the tenth transistor is coupled to the first node, a first electrode of the tenth transistor is coupled to the second node, and a second electrode of the tenth transistor is configured to be coupled to the first voltage terminal to receive the first voltage; the first reset circuit includes an eleventh transistor, a gate electrode of the eleventh transistor is configured to receive a first reset control signal, a first electrode of the eleventh transistor is coupled to the first node, and a second electrode of the eleventh transistor is configured to be coupled to the first voltage terminal to receive the first voltage; the second reset circuit includes a twelfth transistor, a gate electrode of the twelfth transistor is configured to receive a second reset control signal, a first electrode of the twelfth transistor is coupled to the first node, and a second electrode of the twelfth transistor is configured to be coupled to the first voltage terminal to receive the first voltage; the second control circuit includes a fourteenth transistor, a gate electrode of the fourteenth transistor is configured to receive a third control signal, a first electrode of the fourteenth transistor is coupled to the second node, and a second electrode of the fourteenth transistor is configured to be coupled to the first voltage terminal to receive the first voltage; and the third control circuit includes a sixteenth transistor, a gate electrode of the sixteenth transistor is configured to receive a fourth control signal, a first electrode of the sixteenth transistor is coupled to the second node, and a second electrode of the sixteenth transistor is configured to be coupled to the first voltage terminal to receive the first voltage.

At least some embodiments of the present disclosure also provide a gate drive circuit, which includes a plurality of cascaded shift register units as described in any one of the above embodiments.

For example, the gate drive circuit provided by some embodiments of the present disclosure further includes a first sub-clock signal line, a second sub-clock signal line, a third sub-clock signal line, and a fourth sub-clock signal line; an output clock signal terminal of a (4n–3)-th stage shift register unit is coupled to the first sub-clock signal line; an output clock signal terminal of a (4n–2)-th stage shift register unit is coupled to the second sub-clock signal line; an output clock signal terminal of a (4n–1)-th stage shift register unit is coupled to the third sub-clock signal line; an output clock signal terminal of a (4n)-th stage shift register unit is coupled to the fourth sub-clock signal line; and n is an integer greater than 0.

For example, in the gate drive circuit provided by some embodiments of the present disclosure, a first input signal terminal of an (m+2)-th stage shift register unit is coupled to a second signal output terminal of an (m)-th stage shift register unit, a second input signal terminal of an (m+1)-th stage shift register unit is coupled to the second signal output terminal of the (m)-th stage shift register unit, and m is an integer greater than 0.

At least some embodiments of the present disclosure also provide a display device, which includes the gate drive circuit as described in any one of the above embodiments.

At least some embodiments of the present disclosure also provide a drive method of the shift register unit according to any one of the above embodiments, including: in an input phase, in response to the first input signal, inputting the first control signal to the first node through the first input circuit; in an output phase, under control of the level of the first node, outputting the first output signal to the output terminal through the output circuit; and in a noise reduction phase, in response to the level of the output terminal, performing noise reduction on the output terminal through the first noise reduction circuit.

BRIEF DESCRIPTION OF THE DRAWINGS

In order to clearly illustrate the technical solutions of the embodiments of the disclosure, the drawings of the embodiments will be briefly described in the following; and it is obvious that the described drawings are only related to some embodiments of the disclosure and thus are not limitative to the disclosure.

DETAILED DESCRIPTION

Figure 1:
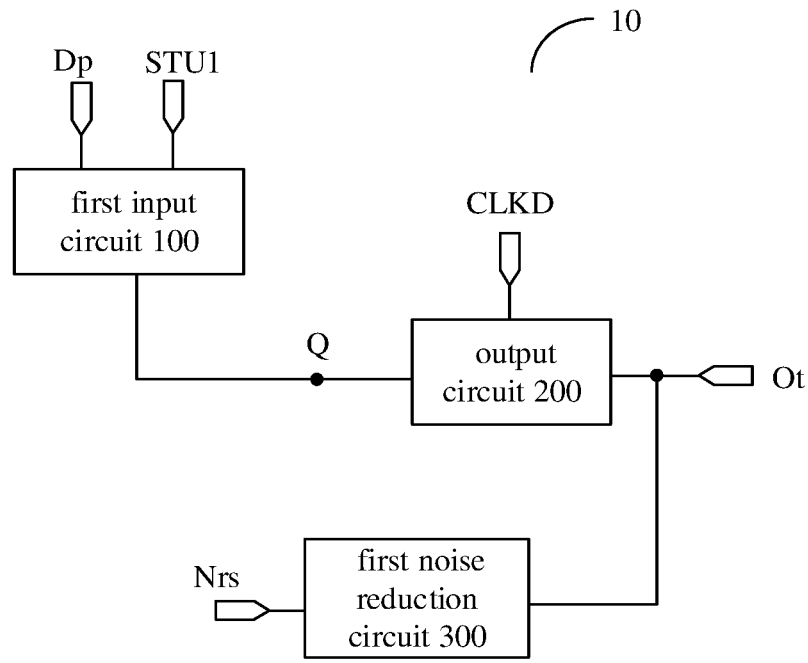
FIG. 1 is a schematic block diagram of a shift register unit provided by some embodiments of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "comprise," "including," etc., are intended to specify that the elements or the objects stated before these terms encompass the elements or the objects and equivalents thereof listed after these terms, but do not preclude the other elements or objects. The phrases "connect", "connected", "couple", "coupled", etc., are not intended to define a physical connection or mechanical connection, but may comprise an electrical connection, directly or indirectly.

"On," "under," "right," "left" and the like are only used to indicate relative position relationship, and when the position of the object which is described is changed, the relative position relationship may be changed accordingly.

In order to keep the following description of embodiments of the present disclosure clear and concise, detailed descriptions of known functions and known components are omitted from the present disclosure.

In an OLED display panel, in order to compensate for display unevenness caused by threshold drift of a drive transistor in a pixel circuit, a voltage drop of a power line, aging of an OLED, and the like, an external electrical compensation method may be adopted. The compensation method generally includes providing a sensing transistor and a sensing line for a conventional pixel circuit, sensing a threshold voltage of the drive transistor or a voltage drop of the OLED in the pixel circuit through the sensing transistor and the sensing line to obtain sensing data, and compensating the pixel circuit based on the sensing data. Such pixel circuit is typically 3T1C pixel circuit (including a scanning transistor, a drive transistor, a sensing transistor, and a storage capacitor), and accordingly an operation period of such pixel circuit also includes a display phase and a sensing phase (or a blanking phase).

Similarly, in the OLED display panel, a shift register unit of the gate drive circuit includes at least two sub-circuits, namely, a display scanning sub-circuit and a connection sub-circuit (or a gate circuit or a Hiz circuit), the display scanning sub-circuit is used for providing a display scanning signal for a scanning transistor in the pixel circuit, and the connection sub-circuit is used for outputting the display scanning signal output by the display scanning sub-circuit. In addition, some shift register units may also include detection sub-circuits, i.e., a shift register unit includes a detection sub-circuit, the display scanning sub-circuit, and the connection sub-circuit that output composite pulses of the detection sub-circuit and the display scanning sub-circuit. In this case, the shift register unit may output an output pulse of a composite waveform composed of two waveforms with different widths and timings, thus providing the display scanning signal and a blanking scanning signal to the scanning transistor and the sensing transistor in the pixel circuit, respectively. However, the structure of the above-described shift register unit is very complex and a size of the above-described shift register unit is large, which is not beneficial to achieving high resolution and narrow frame, and is also not beneficial to reducing the chip area to reduce the cost.

With the increase of the operation time of the gate drive circuit, a threshold voltage of a transistor controlled by a positive voltage for a long time drifts (e.g., positive drift), i.e., a threshold voltage of an N-type transistor gradually increases while a threshold voltage of a P-type transistor gradually decreases, so that in a case where an output clock signal jumps to a high voltage, a signal at an output terminal of an output circuit generates noise due to capacitive coupling, and if the noise at the output terminal cannot be transmitted through a transistor in time, noise phenomenon may be occurred at the output terminal.

At least some embodiments of the present disclosure provide a shift register unit and a drive method thereof, a gate drive circuit and a display device. The shift register unit includes a first noise reduction circuit, a first input circuit, and an output circuit; the first input circuit is coupled to a first node, and is configured to input a first control signal to the first node in response to a first input signal; the output circuit is coupled to the first node and an output terminal, and is configured to output a first output signal to the output terminal under control of a level of the first node; and the first noise reduction circuit is coupled to the output terminal, and is configured to perform noise reduction on the output terminal in response to a level of the output terminal. The circuit structure of the shift register unit is simple, and the shift register unit can perform noise reduction on the output terminal, so that the output signal is prevented from being affected after the threshold voltage of the transistor drifts, the problem of noise generated at the output terminal caused by long-term operation of the gate drive circuit is eliminated, and the reliability of the gate drive circuit is enhanced.

Some embodiments of the present disclosure will be described in detail below with reference to the accompanying drawings, but the present disclosure is not limited to these specific embodiments.

FIG. 1 is a schematic block diagram of a shift register unit provided by some embodiments of the present disclosure. For example, as shown in FIG. 1, a shift register unit 10 may include a first input circuit 100, an output circuit 200, and a first noise reduction circuit 300. A gate drive circuit can be obtained by cascading a plurality of the shift register units 10, and the gate drive circuit is used for driving a display panel and sequentially providing scanning signals for a plurality of gate lines of the display panel, thereby performing progressive or interlaced scanning and the like during a period when the display panel displays a frame of pictures.

For example, as shown in FIG. 1, the first input circuit 100 is coupled to a first node Q, and is configured to input a first control signal to the first node Q (here, a pull-up node) in response to a first input signal. For example, in some examples, the first input circuit 100 is coupled to a first input signal terminal STU1, a first control signal terminal Dp, and the first node Q. Under control of the first input signal provided by the first input signal terminal STU1, in a case where the first input circuit 100 is turned on, the first control signal terminal Dp is coupled to the first node Q, so that the first control signal provided by the first control signal terminal Dp is input to the first node Q, thereby pulling a potential of the first node Q up to an operation potential.

For example, as shown in FIG. 1, the output circuit 200 is coupled to the first node Q and an output terminal Ot, and is configured to output a first output signal to the output terminal Ot under control of a level of the first node Q. For example, in some examples, the output circuit 200 may be coupled to the first node Q, an output clock signal terminal CLKD, and the output terminal Ot, and in a case where the output circuit 200 is turned on under control of a level of the first node Q, an output clock signal provided by the output clock signal terminal CLKD is output to the output terminal Ot, and the first output signal includes the output clock signal.

For example, as shown in FIG. 1, the first noise reduction circuit 300 is coupled to the output terminal Ot, and is configured to perform noise reduction on the output terminal Ot in response to a level of the output terminal Ot. For example, in some examples, the first noise reduction circuit 300 may be coupled to the output terminal Ot and a noise reduction signal terminal Nrs, and in a case where the first noise reduction circuit 300 is turned on under control of the level of the output terminal Ot, an output noise reduction signal provided by the noise reduction signal terminal Nrs is output to the output terminal Ot.

For example, in some embodiments, the first noise reduction circuit 300 may be coupled to the first node Q to receive a level signal of the first node Q, and the output noise reduction signal includes the level signal of the first node Q;

and in other embodiments, the first noise reduction circuit 300 may also be coupled to the output clock signal terminal to receive the output clock signal, and the output noise reduction signal includes the output clock signal.

In a case where the shift register unit 10 does not include the first noise reduction circuit 300, after the shift register unit operates for a long time, the threshold voltages of the transistors in the circuit is prone to drift, e.g., positively drift, so a low level written to the output terminal Ot by the output circuit 200 will be higher than a predetermined value, i.e., there is a noise signal in the signal output from the output terminal Ot. If the noise signal cannot be eliminated in time, the output terminal Ot generates noise ripples. The shift register unit 10 provided by the embodiment of the present disclosure includes the first noise reduction circuit 300, and the first noise reduction circuit 300 can pull down the level of the output terminal Ot to eliminate the noise problem of the output terminal Ot, thereby preventing the output signal from being affected after the threshold voltage of the transistor drifts, and enhancing the reliability of the circuit.

Figure 2:
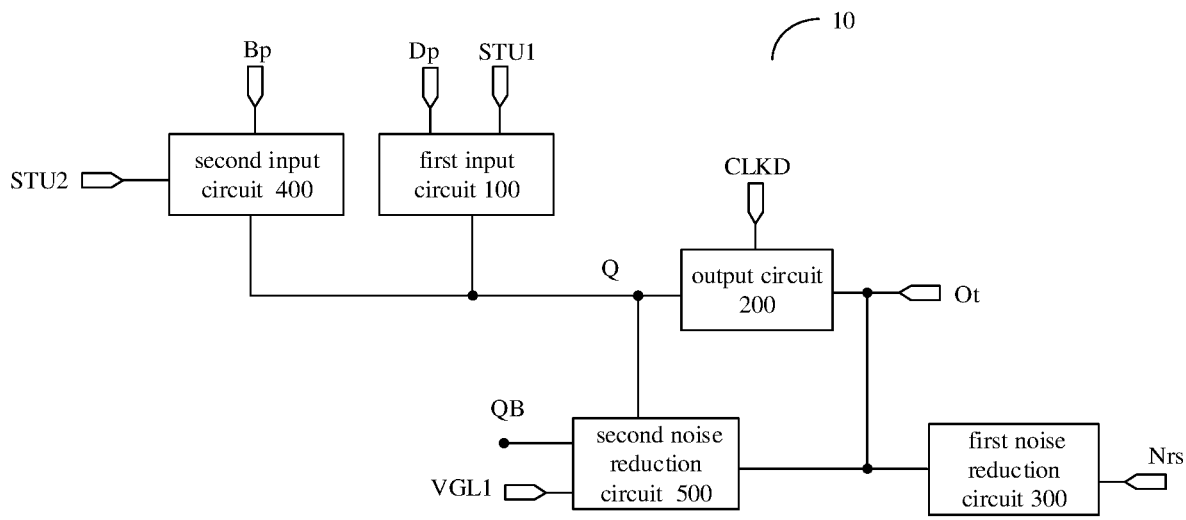
FIG. 2 is a schematic block diagram of another shift register unit provided by some embodiments of the present disclosure.
Figure 3:
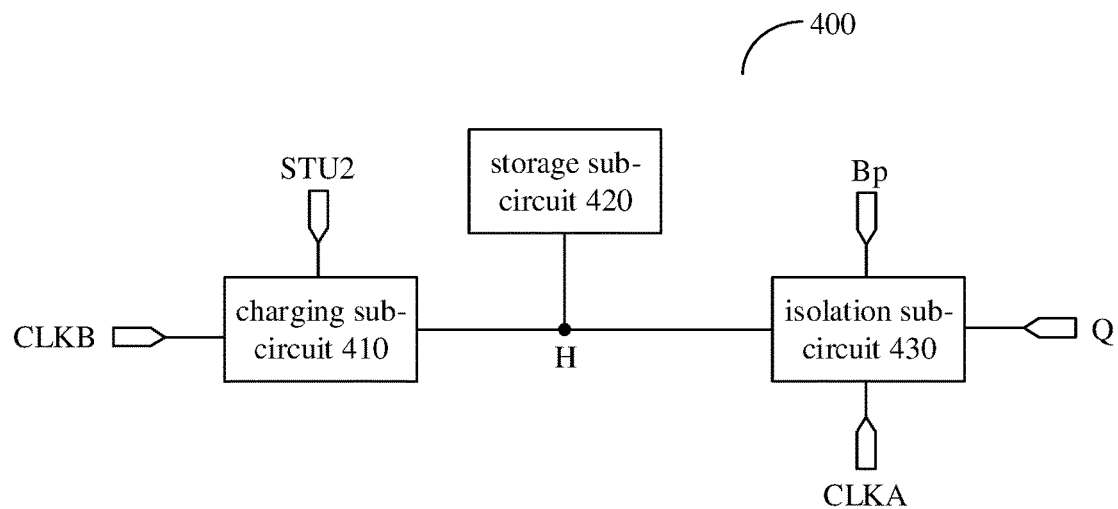
FIG. 3 is a schematic block diagram of a second input circuit of a shift register unit provided by some embodiments of the present disclosure.

FIG. 2 is a schematic block diagram of another shift register unit provided by some embodiments of the present disclosure, and FIG. 3 is a schematic block diagram of a second input circuit of a shift register unit provided by some embodiments of the present disclosure.

For example, as shown in FIG. 2, the shift register unit 10 may further include a second input circuit 400. The second input circuit 400 is coupled to the first node Q, and is configured to input a second control signal to the first node Q according to a second input signal. For example, in some examples, the second input circuit 400 is coupled to a second input signal terminal STU2, a second control signal terminal Bp, and the first node Q, and is configured to receive and store the second input signal provided by the second input signal terminal STU2, and output the second control signal provided by the second control signal terminal Bp to the first node Q according to the second input signal, thereby pulling a potential of the first node Q up to an operation potential.

In the shift register unit 10 provided by the embodiments of the present disclosure, the first input circuit 100 (implemented as a display scanning sub-circuit), the output circuit 200 (implemented as a connection sub-circuit), and the second input circuit 400 (implemented as a detection sub-circuit) can be integrated. In a case where a display panel is driven by a gate drive circuit obtained by cascading a plurality of the shift register units 10, a blanking scanning signal in the blanking phase and a display scanning signal in the display phase of a frame of picture can be output through the same output circuit, thereby simplifying the circuit structure of the shift register unit and the circuit structure of the gate drive circuit obtained by cascading the plurality of the shift register units 10, and reducing the size of the shift register unit and the size of the gate drive circuit including the shift register unit.

For example, as shown in FIG. 2, the output circuit 200 is further configured to output a second output signal to the output terminal Ot under control of the level of the first node Q. For example, the output signal of the output terminal Ot is a composite output signal, and the composite output signal may include a first output signal and a second output signal, and the first output signal and the second output signal may be two mutually independent waveforms having different widths and timings. For example, during a display phase of one frame, the output circuit 200 outputs, via the output terminal Ot, the first output signal to a gate line coupled to the output terminal Ot, under control of the level of the first node Q, to drive scanning transistors in corresponding pixel units through the gate line coupled to the output terminal Ot, thereby performing display; and in a blanking phase of one frame, the output circuit 200 outputs the second output signal via the output terminal Ot, under control of the level of the first node Q, to drive sensing transistors in the corresponding pixel units, thereby performing compensation detection.

For example, the first input circuit 100 is configured to pull up the potential of the first node Q to the operation potential in the display phase of one frame, and the second input circuit 400 is configured to pull up the potential of the first node Q to the operation potential in the blanking phase of one frame. The output circuit 200 is configured to output the first output signal to the output terminal Ot in the display phase of one frame, and the output circuit 200 is further configured to output the second output signal to the output terminal Ot in the blanking phase of one frame.

In the shift register unit 10 provided by the embodiment of the present disclosure, the first input circuit 100 and the second input circuit 400 may share the same output circuit 200 to achieve to output the output signals.

It should be noted that other circuit structures of the shift register unit 10 as shown in FIG. 2 are basically the same as those of the shift register unit 10 as shown in FIG. 1, and repetitions will not be repeated herein.

For example, in an example as shown in FIG. 3, the second input circuit 400 includes a charging sub-circuit 410, a storage sub-circuit 420, and an isolation sub-circuit 430. The shift register unit 10 further includes a first clock signal terminal CLKA and a second clock signal terminal CLKB.

For example, the charging sub-circuit 410 is coupled to a control node H and is configured to input the second input signal to the control node H in response to a second clock signal. For example, in some examples, the charging sub-circuit 410 is coupled to the second input signal terminal STU2, a second clock signal terminal CLKB, and the control node H. In a case where the charging sub-circuit 410 is turned on under control of the second clock signal provided by the second clock signal terminal CLKB, the second input signal terminal STU2 is coupled to the control node H, thereby writing the second input signal to the control node H. For example, in an example, under control of the second clock signal, in a case where the charging sub-circuit 410 is turned on, the second input signal may be at a high level to charge the control node H.

For example, the storage sub-circuit 420 is coupled to the control node H, and is configured to store the second input signal input by the charging sub-circuit 410 into the control node H, so that a high level of the control node H is maintained until the blanking phase of the frame.

For example, the isolation sub-circuit 430 is coupled to the control node H and the first node Q, and is configured to input the second control signal to the first node Q under control of a level of the control node H and the first clock signal. The isolation sub-circuit 430 is disposed between the first node Q and the control node H and is used for preventing the first node Q and the control node H from influencing with each other. For example, in a case where the second control signal does not need to be output to the first node Q, the isolation sub-circuit 430 may disconnect the connection between the first node Q and the control node H. For example, in some examples, the isolation sub-circuit 430 is coupled to the control node H, the first node Q, the second control signal terminal Bp, and the first clock signal terminal CLKA, and is configured to be turned on under common control of the level of the control node H and the first clock signal provided by the first clock signal terminal CLKA, and connect the second control signal terminal Bp and the first node Q, thereby inputting the second control signal to the first node Q. For example, in an example, in a case where the isolation sub-circuit 130 is turned on under common control of the level of the control node H and the first clock signal, the second control signal may be at a high level, thereby charging the first node Q.

It should be noted that in various embodiments of the present disclosure, the second input circuit 400 may include any suitable sub-circuits, may be not limited to the above-mentioned charging sub-circuit 410, storage sub-circuit 420, and isolation sub-circuit 430, as long as corresponding functions can be achieved.

For example, the second input circuit 400 may receive the second input signal and write the second input signal into the control node H during a display phase of one frame, and output the second control signal to the first node Q under control of the level of the control node H and the first clock signal during a blanking phase of the frame, thereby pulling the potential of the first node Q up to the operation potential. For another example, the second input circuit 400 may also receive the second input signal and write the second input signal into the control node H during a blanking phase of one frame, and output the second control signal to the first node Q under control of the level of the control node H and the first clock signal in a blanking phase of an adjacent next frame, thereby pulling the potential of the first node Q up to the operation potential.

For example, as shown in FIG. 2, the shift register unit 10 further includes a second noise reduction circuit 500 (here, a pull-down circuit). The second noise reduction circuit 500 is coupled to the first node Q, a second node QB (here a pull-down node correspondingly), and the output terminal Ot, and is configured to simultaneously perform noise reduction on the first node Q and the output terminal Ot under control of a level of the second node QB. For example, in some examples, the second noise reduction circuit 500 is coupled to the first node Q, the second node QB, the output terminal Ot, and a first voltage terminal VGL1. Under control of the level of the second node QB, in a case where the second noise reduction circuit 500 is turned on, the first node Q and the output terminal Ot are both coupled to the first voltage terminal VGL1, so that the first node Q and the output terminal Ot are pulled down to a non-operation potential through the first voltage terminal VGL1 to implement noise reduction.

It should be noted that in the embodiments of the present disclosure, the first voltage terminal VGL1 may be configured to provide a DC low-level signal, for example, and the following embodiments are the same as those described herein, and repeated portions will not be described again.

Figure 4A:
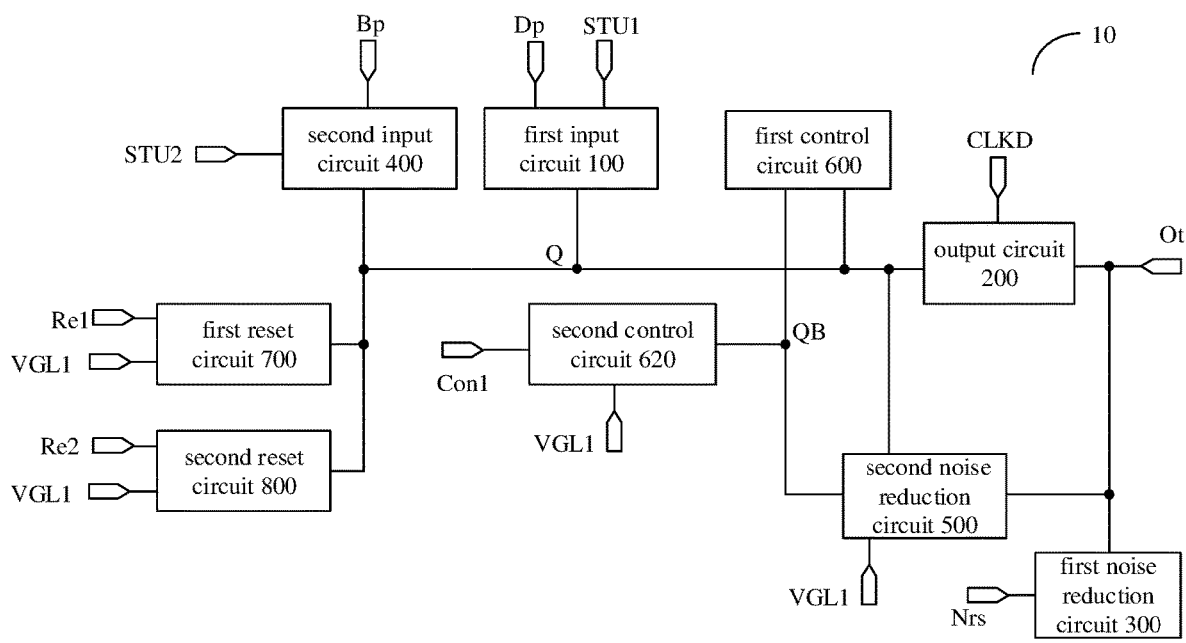
FIG. 4A is a schematic block diagram of yet another shift register unit provided by some embodiments of the present disclosure.
Figure 4B:
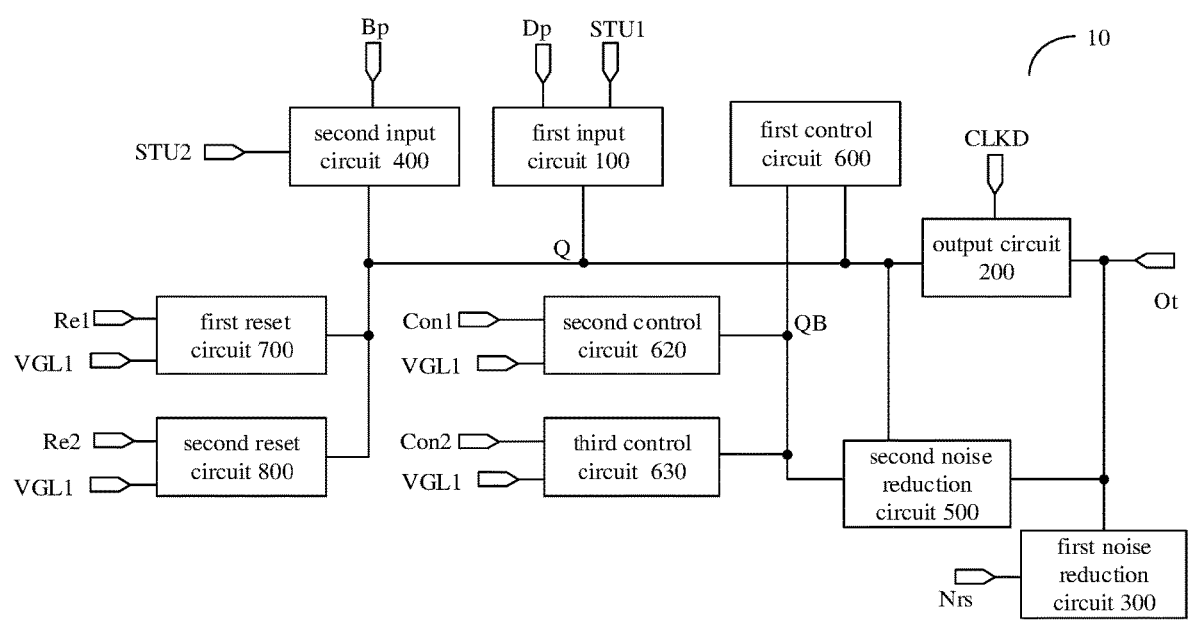
FIG. 4B is a schematic block diagram of still yet another shift register unit provided by some embodiments of the present disclosure.

FIG. 4A is a schematic block diagram of yet another shift register unit provided by some embodiments of the present disclosure; and FIG. 4B is a schematic block diagram of still yet another shift register unit provided by some embodiments of the present disclosure.

For example, as shown in FIG. 4A, the shift register unit 10 further includes a first control circuit 600. The first control circuit 600 is configured to control a level of the second node QB under control of the level of the first node Q. For example, the first control circuit 600 is coupled to the first node Q and the second node QB, and is configured to pull down the level of the second node QB to a low level in a case where the first node Q is at a high level and pull up the level of the second node QB to a high level in a case where the first node Q is at a low level. For example, the first control circuit 600 may be an inverter circuit.

For example, as shown in FIG. 4A, the shift register unit 10 further includes a second control circuit 620. The second control circuit 620 is configured to control the level of the second node QB in response to a third control signal. For example, the second control circuit 620 is coupled to the second node QB, a third control signal terminal Con1 (here, a blanking pull-down control terminal), and the first voltage terminal VGL1. The second control circuit 620 is configured to be turned on under control of the third control signal provided by the third control signal terminal Con1 during a blanking phase of one frame, so that the second node QB is coupled to the first voltage terminal VGL1, and a potential of the second node QB is pulled down to a non-operation potential through the first voltage terminal VGL1. Therefore, in the blanking phase, the influence of the second node QB on the first node Q is reduced, so that the second input circuit 400 charges the first node Q more fully.

In the shift register unit provided by the embodiment of the present disclosure, the second control circuit 620 can pull down the second node QB in a blanking phase of one frame to ensure that the second node QB is at a low level. In a case where the second input circuit 400 writes a high level to the first node Q, the high level of the first node Q reaches a predetermined value, so that the output signal can be prevented from being affected after the threshold voltage of the transistor drifts, and the reliability of the circuit is enhanced.

For example, as shown in FIG. 4B, the shift register unit 10 further includes a third control circuit 630. The third control circuit 630 is configured to control the level of the second node QB in response to the fourth control signal. For example, in an example, the third control circuit 630 is coupled to a fourth control signal terminal Con2 (here, a pull-down control terminal), the second node QB, and the first voltage terminal VGL1. In the display phase of one frame, the third control circuit 630 is configured to be turned on under control of the fourth control signal provided by the fourth control signal terminal Con2, so that the second node QB is coupled to the first voltage terminal VGL1, and the potential of the second node QB is pulled down to a non-operation potential through the first voltage terminal VGL1, thereby reducing the influence of the second node QB on the first node Q in the display phase, so that the first input circuit 100 charges the first node Q more fully.

In the shift register unit provided by the embodiment of the present disclosure, the third control circuit 630 can pull down the second node QB in a display phase of one frame to ensure that the second node QB is at a low level. In a case where the first input circuit 100 writes a high level to the first node Q, the high level of the first node Q reaches a predetermined value, so that the output signal can be prevented from being affected after the threshold voltage of the transistor drifts, and the reliability of the circuit is enhanced.

It should be noted that in the shift register unit provided by the embodiment of the present disclosure, unlike the examples as shown in FIGS. 4A and 4B, the shift register unit may also include only the third control circuit 630 and not include the second control circuit 620.

For example, as shown in FIGS. 4A and 4B, the shift register unit 10 further includes a first reset circuit 700 (here, a blanking reset circuit) and a second reset circuit 800 (here, a display reset circuit).

For example, the first reset circuit 700 is configured to reset the first node Q in response to a first reset control signal. For example, as shown in FIGS. 4A and 4B, the first reset circuit 700 is coupled to a first reset control signal terminal Re1, the first node Q, and the first voltage terminal VGL1. The first reset circuit 700 is configured to be turned on under control of the first reset control signal provided by the first reset control signal terminal Re1, so that the first node Q is coupled to the first voltage terminal VGL1, and furthermore the first node Q is reset by the first voltage terminal VGL1. For example, in a blanking phase of one frame, after the output circuit 200 outputs the second output signal, the first node Q is reset by the first voltage terminal VGL1; and for another example, before a display phase of one frame, the first reset circuit 700 may be turned on in response to the first reset control signal, so that the first node Q may be reset by the first voltage terminal VGL1.

For example, the second reset circuit 800 is configured to reset the first node Q in response to a second reset control signal. For example, as shown in FIGS. 4A and 4B, the second reset circuit 800 may be coupled to a second reset control signal terminal Re2, the first node Q, and the first voltage terminal VGL1. The second reset circuit 800 is configured to be turned on under control of the second reset control signal provided by the second reset control signal terminal Re2, so that the first node Q is coupled to the first voltage terminal VGL1, and furthermore the first node Q is reset by the first voltage terminal VGL1. For example, in a display phase of one frame, after the output circuit 200 outputs the first output signal, the second reset circuit 800 may be turned on in response to the second reset control signal, thereby resetting the first node Q by the first voltage terminal VGL1.

It should be noted that, in the examples as shown in FIGS. 4A and 4B, the first control circuit 600, the second control circuit 620, the third control circuit 630, the first reset circuit 700, and the second reset circuit 800 are all coupled to the first voltage terminal VGL1 to receive a DC low-level signal, but the embodiments of the present disclosure are not limited thereto. The first control circuit 600, the second control circuit 620, the third control circuit 630, the first reset circuit 700, and the second reset circuit 800 may also be coupled to different power supply voltage terminals respectively to receive different low-level signals. As long as corresponding functions can be achieved, the present disclosure is not particularly limited to this case.

It should be noted that other circuit structures of each of the shift register units 10 as shown in FIGS. 4A and 4B are basically the same as those of the shift register unit 10 as shown in FIG. 2, and the repeated portions will not be described again.

Figure 5A:
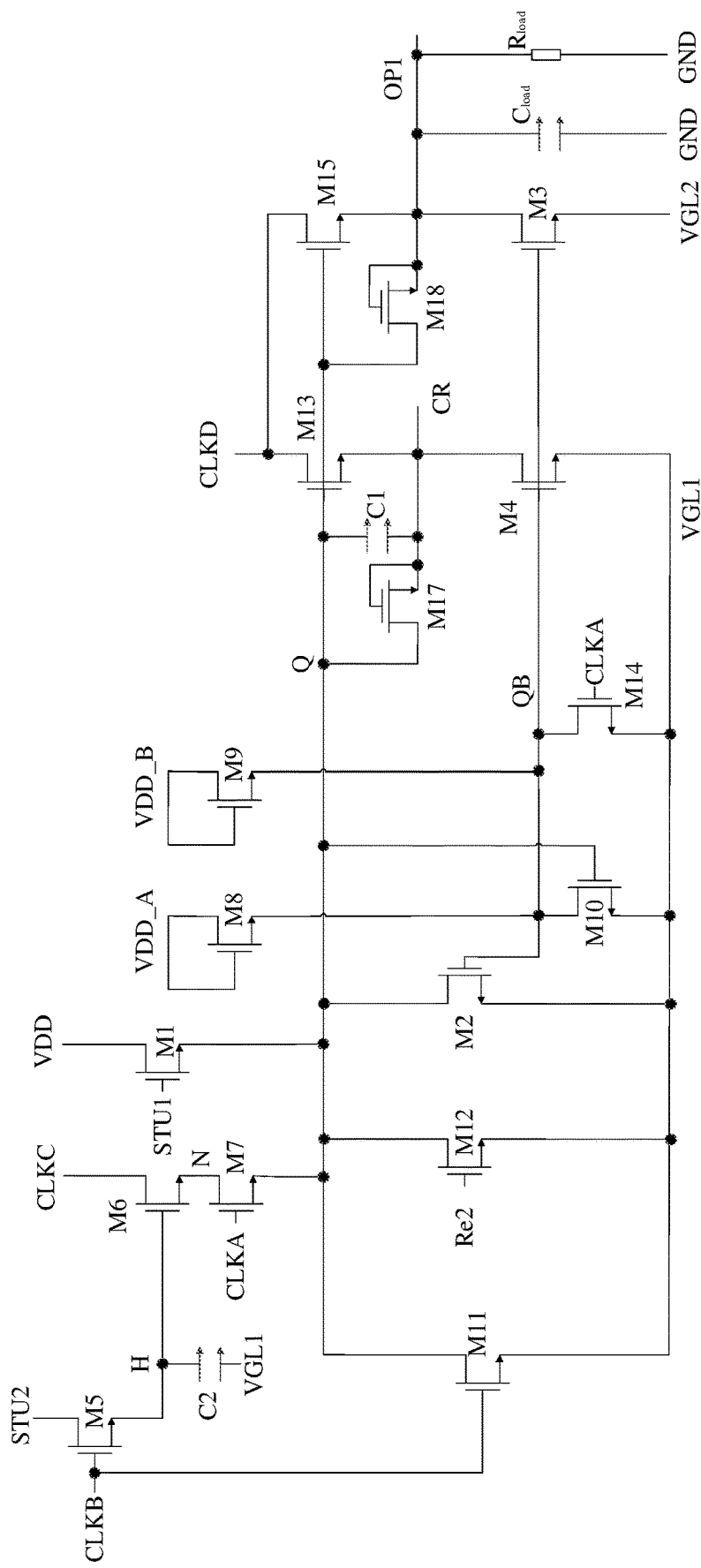
FIG. 5A is a circuit structure diagram of the shift register unit as shown in FIG. 4A.
Figure 5B:
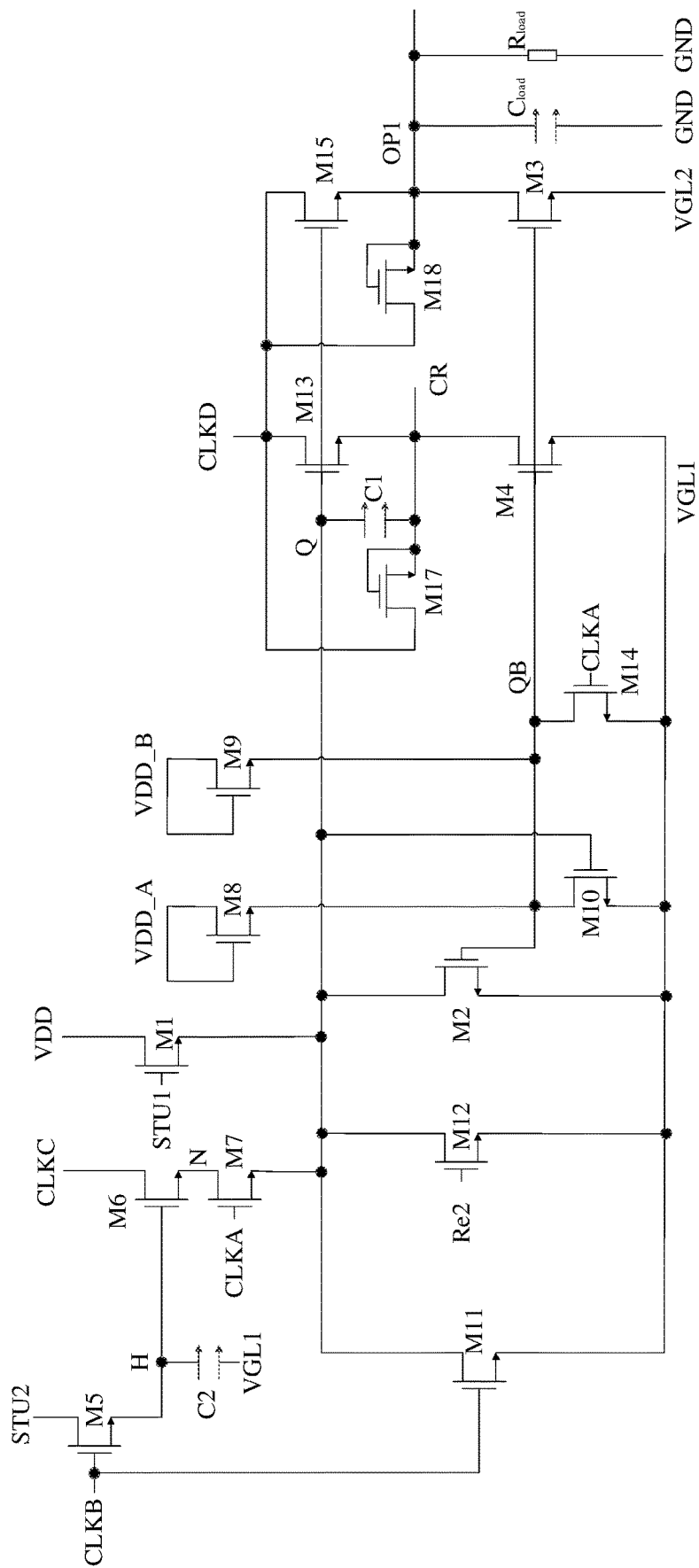
FIG. 5B is another circuit structure diagram of the shift register unit as shown in FIG. 4A.

FIG. 5A is a circuit structure diagram of the shift register unit as shown in FIG. 4A, and FIG. 5B is another circuit structure diagram of the shift register unit as shown in FIG. 4A. The following description of the present disclosure is illustrated by taking a case that each transistor is an N-type transistor as an example, but this case does not constitute a limitation on the embodiments of the present disclosure.

For example, as shown in FIGS. 5A and 5B, the first noise reduction circuit 300 includes a first noise reduction transistor M18. The output terminal Ot includes a first signal output terminal OP1. The first signal output terminal OP1 is used to provide a drive signal for the pixel circuit.

For example, as shown in FIG. 5A, in some examples, a gate electrode of the first noise reduction transistor M18 and a first electrode of the first noise reduction transistor M18 are both coupled to the first signal output terminal OP1, and a second electrode of the first noise reduction transistor M18 is coupled to the first node Q to receive a level signal of the first node Q. The output noise reduction signal includes the level signal of the first node Q, and the first noise reduction transistor M18 is configured to, in response to a level of the first signal output terminal OP1, perform noise reduction on the first signal output terminal OP1 using the level signal of the first node Q.

For example, as shown in FIG. 5A, the first signal output terminal OP1 is coupled to a load circuit, the load circuit includes a load capacitor $C_{load}$ and a load resistor $R_{load}$. A first electrode of the load capacitor $C_{load}$ is coupled to the first signal output terminal OP1, and a second electrode of the load capacitor $C_{load}$ is grounded. One terminal of the load resistor $R_{load}$ is coupled to the first signal output terminal OP1, and the other terminal of the load resistor $R_{load}$ is grounded.

For example, because a threshold voltage of a transistor (e.g., M3 as shown in FIGS. 5A and 5B) drifts (e.g., positively drifts), and the turn-on degree of the transistor (e.g., M3 as shown in FIGS. 5A and 5B) is relatively low, so that the first voltage with a low level written to the first signal output terminal OP1 is insufficient, and noise reduction is performed insufficiently, thereby causing the first signal output terminal OP1 to generate a noise signal, and the noise signal is accumulated on the output gate line (e.g., on the load capacitance $C_{load}$), the noise signal cannot be eliminated in time, and the signal output from the first signal output terminal OP1 generates noise ripples; the first sub-output signal output by the first signal output terminal OP1 is a low-level signal, and the first node Q is a low-level signal. The noise signal accumulated on the load capacitor $C_{load}$ will cause a low level of the first sub-output signal to be higher than a predetermined value, so that there is a voltage difference between the first signal output terminal OP1 and the first node Q, and the level of the first signal output terminal OP1 is higher than the level of the first node Q; and thus, the first noise reduction transistor M18 is turned on, and the level of the first signal output terminal OP1 is pulled down by the level signal of the first node Q, so that the first sub-output signal output by the first signal output terminal OP1 reaches a predetermined value. So the noise signal accumulated on the load capacitor $C_{load}$ can be eliminated, and the noise problem of the first signal output terminal OP1 can be solved.

For example, the low level of the output clock signal may be identical to a low level of the first voltage output by the first voltage terminal VGL1.

For example, as shown in FIG. 5B, in other examples, the gate electrode of the first noise reduction transistor M18 and the first electrode of the first noise reduction transistor M18 are both coupled to the first signal output terminal OP1, and the second electrode of the first noise reduction transistor M18 is coupled to the output clock signal terminal CLKD to receive the output clock signal. The output noise reduction signal includes the output clock signal, and the first noise reduction transistor M18 is configured to perform noise reduction on the first signal output terminal OP1 with the output clock signal in response to the level of the first signal output terminal OP1.

For example, similar to the example as shown in FIG. 5A, in a case where the first sub-output signal output by the first signal output terminal OP1 is at a low level, the output clock signal is also a low-level signal. The noise signal accumulated on the load capacitor $C_{load}$ will cause the low level of the first sub-output signal to be higher than a predetermined value, and thus, there is a voltage difference between the first signal output terminal OP1 and the output clock signal terminal CLKD, and the level of the first signal output terminal OP1 is higher than the level of the output clock signal terminal CLKD. Therefore, the first noise reduction transistor M18 is turned on, and the level of the first signal output terminal OP1 is pulled down by the output clock signal, so that the first sub-output signal output by the first signal output terminal OP1 reaches a predetermined value, the noise signal accumulated on the load capacitor $C_{load}$ is eliminated, and the noise problem of the first signal output terminal OP1 is solved.

For example, as shown in FIGS. 5A and 5B, the output circuit 200 includes a first output transistor M15. A gate electrode of the first output transistor M15 is configured to be coupled to the first node Q, a first electrode of the first output transistor M15 is configured to be coupled to the output clock signal terminal CLKD to receive the output clock signal, and a second electrode of the first output transistor M15 is configured to be coupled to the first signal output terminal OP1. For example, in a case where the first node Q is at an operation potential (e.g., a high level), the first output transistor M15 is turned on, thereby outputting an output clock signal to the first signal output terminal OP1 as a first sub-output signal, the first output signal including the first sub-output signal.

For example, as shown in FIGS. 5A and 5B, the first noise reduction circuit 300 further includes a second noise reduction transistor M17, and the output terminal Ot further includes a second signal output terminal CR. In a case where a plurality of shift register units are cascaded to obtain a gate drive circuit, the second signal output terminal CR is used to provide a second input signal for a previous stage shift register unit. For example, an output signal of the first signal output terminal OP1 may be identical to an output signal of the second signal output terminal CR.

For example, as shown in FIG. 5A, in some examples, a gate electrode of the second noise reduction transistor M17 and a first electrode of the second noise reduction transistor M17 are both coupled to the second signal output terminal CR, a second electrode of the second noise reduction transistor M17 is coupled to the first node Q to receive the level signal of the first node Q, and the second noise reduction transistor M17 is configured to, in response to a level of the second signal output terminal CR, perform noise reduction on the second signal output terminal CR using the level signal of the first node Q.

For example, as shown in FIG. 5B, in other examples, the gate electrode of the second noise reduction transistor M17 and the first electrode of the second noise reduction transistor M17 are both coupled to the second signal output terminal CR, the second electrode of the second noise reduction transistor M17 is coupled to the output clock signal terminal CLKD to receive the output clock signal, and the output noise reduction signal includes the output clock signal. For example, the second noise reduction transistor M17 is configured to perform noise reduction on the second signal output terminal CR using the output clock signal in response to the level of the second signal output terminal CR.

For example, as shown in FIGS. 5A and 5B, the output circuit 200 further includes a second output transistor M13 and a first capacitor C1. A gate electrode of the second output transistor M13 is configured to be coupled to the first node Q, a first electrode of the second output transistor M13 is configured to be coupled to the output clock signal terminal CLKD to receive the output clock signal, and a second electrode of the second output transistor M13 is configured to be coupled to the second signal output terminal CR. A first electrode of the first capacitor C1 is configured to be coupled to the first node Q, and a second electrode of the first capacitor C1 is configured to be coupled to the second electrode of the second output transistor M13.

For example, in a display phase of one frame, the output circuit 200 is configured to output the first output signal to the output terminal Ot. Specifically, in the display phase of one frame, the output clock signal is transmitted to the first signal output terminal OP1 via the first output transistor M15 and serves as the first sub-output signal, and the output clock signal is also transmitted to the second signal output terminal CR via the second output transistor M13 and serves as the second sub-output signal. The output terminal Ot includes the first signal output terminal OP1 and the second signal output terminal CR, and the first output signal may include the first sub-output signal and the second sub-output signal.

For example, because a threshold voltage of a transistor (e.g., M4 shown in FIGS. 5A and 5B) drifts (e.g., positively drifts), the second signal output terminal CR generates a noise signal, and the noise signal is accumulated on the first capacitor C1, the noise signal cannot be eliminated in time, the signal output from the second signal output terminal CR generates noise ripples, the second sub-output signal output from the second signal output terminal CR is a low-level signal, and the first node Q is also a low-level signal. Because a low level of the second sub-output signal is higher than a predetermined value, there is a voltage difference between the second signal output terminal CR and the first node Q, and the second noise reduction transistor M17 is turned on, so that the level of the second signal output terminal CR is pulled down by the level signal of the first node Q or the output clock signal, the second sub-output signal output by the second signal output terminal CR reaches the predetermined value, the noise signal accumulated on the first capacitor C1 is eliminated, and the noise problem of the second signal output terminal CR is solved. It should be noted that the process of performing noise reduction on the second signal output terminal CR by the second noise reduction transistor M17 is similar to the process of performing noise reduction on the first signal output terminal OP1 by the first noise reduction transistor M18, and the repeated portions will not be described again.

It should be noted that in various embodiments of the present disclosure, the first capacitor C1 and the load capacitor $C_{load}$ may be capacitor devices fabricated by a process manufacturing, for example, the capacitor devices are fabricated by fabricating special capacitor electrodes, and each electrode of the capacitor may be implemented by a metal layer, a semiconductor layer (e.g., a doped polysilicon), etc. The first capacitor C1 can also be a parasitic capacitor between transistors, and can be implemented by the transistors themselves and other devices and circuits, as long as the level of the first node Q can be maintained and the bootstrap function can be implemented in a case where the first signal output terminal OP1 or the second signal output terminal CR outputs a signal.

For example, in the embodiments as shown in FIGS. 5A and 5B, a second voltage terminal VDD is equivalent to the aforementioned first control signal terminal Dp. For example, the second voltage terminal VDD is configured to provide a second voltage, and the second voltage may be a DC high-level signal (e.g., higher than or equal to a high-level portion of the clock signal). The following embodiments are identical to those described herein and repeated portions will not be described again.

For example, as shown in FIGS. 5A and 5B, the first input circuit 100 includes a first transistor M1. A gate electrode of the first transistor M1 is configured to be coupled to the first input signal terminal STU1 to receive the first input signal, a first electrode of the first transistor M1 is configured to be coupled to the second voltage terminal VDD to receive the second voltage, and a second electrode of the first transistor M1 is configured to be coupled to the first node Q. The first control signal includes the second voltage. In a case where the first input signal is at an effective level (e.g., a high level), the first transistor M1 is turned on to connect the second voltage terminal VDD with the first node Q, so that the second voltage is written to the first node Q, thereby pulling the potential of the first node Q up to the operation potential.

For example, as shown in FIGS. 5A and 5B, the second noise reduction circuit 500 includes a second transistor M2, a third transistor M3, and a fourth transistor M4. For example, in some examples, a channel width-to-length ratio of the third transistor M3 and a channel width-to-length ratio of the fourth transistor M4 are both larger than a channel width-to-length ratio of the second transistor M2.

For example, a gate electrode of the second transistor M2 is configured to be coupled to the second node QB, a first electrode of the second transistor M2 is configured to be coupled to the first node Q, and a second electrode of the second transistor M2 is configured to be coupled to the first voltage terminal VGL1 to receive the first voltage; a gate electrode of the third transistor M3 is configured to be coupled to the second node QB, a first electrode of the third transistor M3 is configured to be coupled to the first signal output terminal OP1, and a second electrode of the third transistor M3 is configured to be coupled to a third voltage terminal VGL2 to receive a third voltage; and a gate electrode of the fourth transistor M4 is configured to be coupled to the second node QB, a first electrode of the fourth transistor M4 is configured to be coupled to the second signal output terminal CR, and a second electrode of the fourth transistor M4 is configured to be coupled to the first voltage terminal VGL1 to receive the first voltage.

For example, the third voltage terminal VGL2 is configured to provide the third voltage, and the third voltage may be a DC low-level signal (e.g., lower than or equal to the low-level portion of the clock signal). The following embodiments are the same as those described herein and the repeated portions will not be described again. For example, in an example, the third voltage provided by the third voltage terminal VGL2 is higher than the first voltage provided by the first voltage terminal VGL1 to prevent a leakage phenomenon from occurring at the first signal output terminal OP1. In another example, the third voltage provided by the third voltage terminal VGL2 may be equal to the first voltage provided by the first voltage terminal VGL1. According to actual requirements, the third voltage and the first voltage may be the same or different, and the present disclosure is not limited to this case.

For example, in a case where the second node QB is at an effective level (e.g., a high level), the second transistor M2, the third transistor M3, and the fourth transistor M4 are all turned on, the first node Q and the second signal output terminal CR are both coupled to the first voltage terminal VGL1, and the first signal output terminal OP1 is coupled to the second voltage terminal VGL2, so that noise reduction is simultaneously performed on the first node Q, the first signal output terminal OP1, and the second signal output terminal CR. It should be noted that in various embodiments of the present disclosure, in a case where the output terminal Ot includes a plurality of first signal output terminals OP1 and/or a plurality of second signal output terminals CR, the second noise reduction circuit 500 correspondingly includes a plurality of transistors coupled in one-to-one correspondence to the plurality of first signal output terminals OP1 and/or the plurality of second signal output terminals CR, to perform noise reduction on the plurality of first signal output terminals OP1 and/or the plurality of second signal output terminals CR, respectively.

For example, as shown in FIGS. 5A and 5B, the charging sub-circuit 410 may include a fifth transistor M5, the storage sub-circuit 420 may include a second capacitor C2, and the isolation sub-circuit 430 may include a sixth transistor M6 and a seventh transistor M7.

For example, a gate electrode of the fifth transistor M5 is configured to be coupled to the second clock signal terminal CLKB to receive a second clock signal, a first electrode of the fifth transistor M5 is configured to be coupled to the second input signal terminal STU2 to receive the second input signal, and a second electrode of the fifth transistor M5 is configured to be coupled to the control node H. In a case where the second clock signal is at an effective level (e.g., high level), the fifth transistor M5 is turned on, and the second input signal terminal STU2 is coupled to the control node H, thereby writing the second input signal to the control node H. In this case, for example, the second input signal is at a high level to charge the control node H.

For example, a first electrode of the second capacitor C2 is configured to be coupled to the control node H, and a second electrode of the second capacitor C2 is configured to be coupled to the first voltage terminal VGL1 to receive the first voltage. In a case where the second input signal is written to the control node H, the control node H is charged to a high level, and the second capacitor C2 stores the second input signal (high level) written to the control node H and maintains the control node H at a high level for use in a subsequent phase.

It should be noted that in various embodiments of the present disclosure, the second capacitor C2 may be a capacitor device manufactured by a process manufacturing, for example, special capacitor electrodes are manufactured to achieve the capacitor device, each electrode of the capacitor may be implemented by a metal layer, a semiconductor layer (e.g., a doped polysilicon), etc., and the second capacitor C2 may also be a parasitic capacitor between various devices, and may be implemented by the transistor itself and other devices and circuits. The connection mode of the second capacitor C2 is not limited to the above-described mode, but may be other suitable connection modes as long as the second input signal written to the control node H can be stored. For example, in other examples, a first electrode of the second capacitor C2 is coupled to the control node H, and a second electrode of the second capacitor C2 is coupled to one terminal of the isolation sub-circuit 430 (e.g., a third clock signal terminal CLK described below); and alternatively, the first electrode of the second capacitor C2 is coupled to the control node H, and the second electrode of the second capacitor C2 is coupled to a certain position in the isolation sub-circuit 130 (e.g., a connection node N between the sixth transistor M6 and the seventh transistor M7).

For example, in the embodiment as shown in FIGS. 5A and 5B, the third clock signal terminal CLKC is equivalent to the aforementioned second control signal terminal Bp.

For example, a gate electrode of the sixth transistor M6 is configured to be coupled to the control node H, a first electrode of the sixth transistor M6 is configured to be coupled to the third clock signal terminal CLKC to receive the third clock signal, and a second electrode of the sixth transistor M6 is configured to be coupled to a first electrode of the seventh transistor M7. The second control signal includes the third clock signal. A gate electrode of the seventh transistor M7 is configured to be coupled to the first clock signal terminal CLKA to receive the first clock signal, and a second electrode of the seventh transistor M7 is configured to be coupled to the first node Q. In a case where the level of the control node H is a high level and the level of the first clock signal is also a high level, both the sixth transistor M6 and the seventh transistor M7 are turned on, and the third clock signal terminal CLKC is coupled to the first node Q, thereby writing the third clock signal to the first node Q and pulling up the potential of the first node Q to the operation potential.

For example, as shown in FIGS. 5A and 5B, the first control circuit 600 may include an eighth transistor M8, a ninth transistor M9, and a tenth transistor M10. A gate electrode of the eighth transistor M8 is coupled to a first electrode of the eighth transistor M8, and is configured to be coupled to a fourth voltage terminal VDD_A to receive a fourth voltage, and a second electrode of the eighth transistor M8 is configured to be coupled to the second node QB. A gate electrode of the ninth transistor M9 is coupled to a first electrode of the ninth transistor M9, and is configured to be coupled to a fifth voltage terminal VDD_B to receive a fifth voltage, and a second electrode of the ninth transistor M9 is configured to be coupled to the second node QB. A gate electrode of the tenth transistor M10 is configured to be coupled to the first node Q, a first electrode of the tenth transistor M10 is configured to be coupled to the second node QB, and a second electrode of the tenth transistor M10 is configured to be coupled to the first voltage terminal VGL1 to receive the first voltage.

For example, in an example, the fourth voltage terminal VDD_A is configured to provide a DC low-level signal and the fifth voltage terminal VDD_B is configured to provide a DC high-level signal, so that the eighth transistor M8 is always turned off and the ninth transistor M9 is always turned on. For example, in another example, the fourth voltage terminal VDD_A and the fifth voltage terminal VDD_B are configured to alternately provide a DC high-level signal, so that the eighth transistor M8 and the ninth transistor M9 are alternately turned on to avoid performance drift caused by long-term conduction of the transistors. For example, in a case where the fourth voltage terminal VDD_A provides a high-level signal and the fifth voltage terminal VDD_B provides a low-level signal, the eighth transistor M8 is turned on and the ninth transistor M9 is turned off. In a case where the fifth voltage terminal VDD_B provides a high-level signal and the fourth voltage terminal VDD_A provides a low-level signal, the eighth transistor M8 is turned off and the ninth transistor M9 is turned on.

For example, in a case where the first node Q is at an effective level (e.g., a high level), the tenth transistor M10 is turned on, and the potential of the second node QB can be pulled down to a low level by designing a proportional relationship between a channel width-to-length ratio of the tenth transistor M10 and a channel width-to-length ratio of the eighth transistor M8, which is turned on, or a channel width-to-length ratio of the ninth transistor M9, which is turned on. In a case where the first node Q is at a low level, the tenth transistor M10 is turned off. If the eighth transistor M8 is turned on and the ninth transistor M9 is turned off, the high-level signal provided by the fourth voltage terminal VDD_A is written into the second node QB through the eighth transistor M8 to pull up the potential of the second node QB to a high level. If the eighth transistor M8 is turned off and the ninth transistor M9 is turned on, the high-level signal provided by the fifth voltage terminal VDD_B is written into the second node QB through the ninth transistor M9 to pull up the potential of the second node QB to the high level.

For example, in the embodiments as shown in FIGS. 5A and 5B, the second clock signal terminal CLKB is equivalent to the aforementioned first reset control signal terminal Re1.

For example, as shown in FIGS. 5A and 5B, the first reset circuit 700 may include an eleventh transistor M11. A gate electrode of the eleventh transistor M11 is configured to be coupled to the second clock signal terminal CLKB to receive the second clock signal (that is, the first reset control signal), a first electrode of the eleventh transistor M11 is configured to be coupled to the first node Q, and a second electrode of the eleventh transistor M11 is configured to be coupled to the first voltage terminal VGL1 to receive the first voltage. The first reset control signal includes the second clock signal supplied from the second clock signal terminal CLKB. For example, in a blanking phase of one frame, in a case where the second clock signal is at an effective level (e.g., a high level), the eleventh transistor M11 is turned on, and the first node Q is coupled to the first voltage terminal VGL1, thereby resetting the first node Q.

For example, as shown in FIGS. 5A and 5B, the second reset circuit 800 may include a twelfth transistor M12. A gate electrode of the twelfth transistor M12 is configured to be coupled to a second reset control signal terminal Re2 to receive a second reset control signal, a first electrode of the twelfth transistor M12 is configured to be coupled to the first node Q, and a second electrode of the twelfth transistor M12 is configured to be coupled to the first voltage terminal VGL1 to receive the first voltage. For example, in a display phase of one frame, in a case where the second reset control signal is at an effective level (e.g., a high level), the twelfth transistor M12 is turned on, and the first node Q is coupled to the first voltage terminal VGL1, so that the first node Q is reset.

For example, in an example, in a case where a plurality of shift register units 10 are cascaded to implement a gate drive circuit, a second signal output terminal CR of an (n+2)-th stage shift register unit 10 is coupled to a second reset control signal terminal Re2 of an (n)-th stage shift register unit 10 to take a signal output from the second signal output terminal CR of the (n+2)-th stage shift register unit 10 as a second reset control signal of the (n)-th stage shift register unit 10. Here, n is an integer greater than 0. Of course, the embodiment of the present disclosure is not limited to this case, and the second reset control signal terminal Re2 may also be coupled to a separately provided signal terminal.

For example, in the embodiments shown in FIGS. 5A and 5B, the first clock signal terminal CLKA is equivalent to the aforementioned third control signal terminal Con1, and the third control signal includes the first clock signal.

For example, as shown in FIGS. 5A and 5B, the second control circuit 620 may include a fourteenth transistor M14. A gate electrode of the fourteenth transistor M14 is configured to be coupled to the first clock signal terminal CLKA to receive the first clock signal (i.e., the third control signal), a first electrode of the fourteenth transistor M14 is configured to be coupled to the second node QB, and a second electrode of the fourteenth transistor M14 is configured to be coupled to the first voltage terminal VGL1 to receive the first voltage. For example, in a blanking phase of one frame, in a case where the first clock signal is at an effective level (e.g., a high level), the fourteenth transistor M14 is turned on, and the second node QB is coupled to the first voltage terminal VGL1, thereby pulling down the second node QB to a low level.

Figure 6:
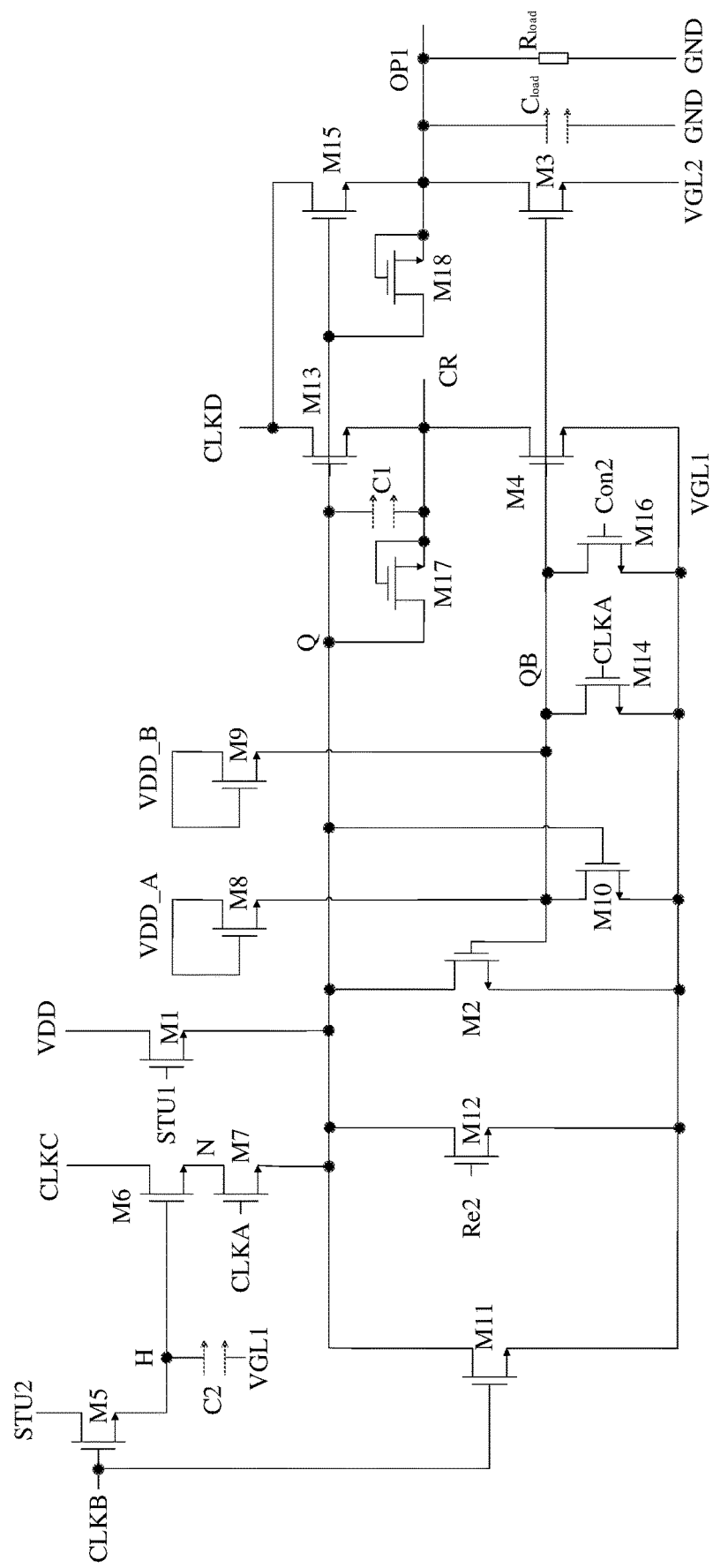
FIG. 6 is a circuit structure diagram of the shift register unit as shown in FIG. 4B.

FIG. 6 is an exemplary circuit structure diagram of the shift register unit as shown in FIG. 4B.

For example, as shown in FIG. 6, the third control circuit 630 may include a sixteenth transistor M16. A gate electrode of the sixteenth transistor M16 is configured to be coupled to a fourth control signal terminal Con2 to receive a fourth control signal, a first electrode of the sixteenth transistor M16 is configured to be coupled to the second node QB, and a second electrode of the sixteenth transistor M16 is configured to be coupled to the first voltage terminal VGL1 to receive the first voltage. Other structures of the shift register unit 10 as shown in FIG. 6 are basically identical to those of the shift register unit 10 described in FIG. 5A, and details will not be described here again. In a display phase of one frame, in a case where the fourth control signal is at an effective level (e.g., high level), the sixteenth transistor M16 is turned on, and the second node QB is coupled to the first voltage terminal VGL1, thereby pulling down the second node QB to a low level.

For example, in an example, in a case where a plurality of shift register units 10 are cascaded to implement a gate drive circuit, a second signal output terminal CR of an (m−2)-th stage shift register unit 10 is coupled to a fourth control signal terminal Con2 of an (m)-th stage shift register unit 10 to take a signal output from the second signal output terminal CR of the (m−2)-th stage shift register unit 10 as a fourth control signal of the (m)-th stage shift register unit 10. Here, m is an integer greater than 2. Of course, the embodiment of the present disclosure is not limited to this case, and the fourth control signal terminal Con2 may also be coupled to a separately provided signal terminal.

It should be noted that in various embodiments of the present disclosure, the specific implementations of the first input circuit 100, the output circuit 200, the first noise reduction circuit 300, the second input circuit 400, the second noise reduction circuit 500, the first control circuit 600, the second control circuit 620, the third control circuit 630, the first reset circuit 700, and the second reset circuit 800 are not limited to the above-described implementations, but may be any suitable implementation, such as a conventional connection method well known to those skilled in the art, and as long as the corresponding functions can be ensured to be implemented.

Figure 7:
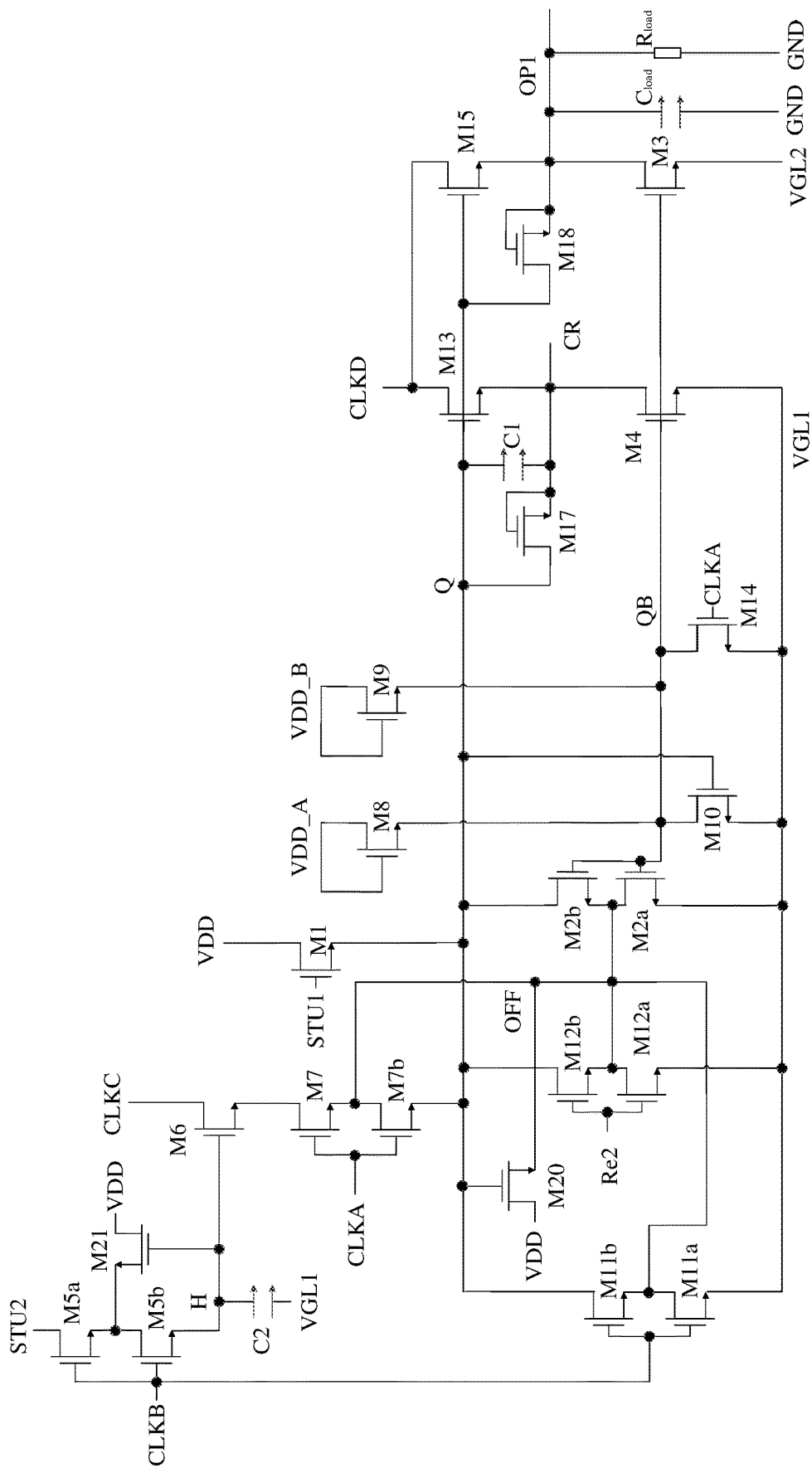
FIG. 7 is still another circuit structure diagram of the shift register unit as shown in FIG. 4A.

FIG. 7 is another exemplary circuit structure diagram of the shift register unit as shown in FIG. 4A.

For example, as shown in FIG. 7, the shift register unit 10 of the embodiment is substantially identical to the shift register unit 10 described in FIG. 5A except that the shift register unit 10 as shown in FIG. 7 further includes a plurality of leakage prevention circuits. In the shift register unit 10 as shown in FIG. 5A, the potential of the first node Q can be maintained by the first capacitor C2, and the potential of the control node H can be maintained by the second capacitor C2. In a case where the potential of the first node Q and/or the potential of the control node H is maintained at a high level, first electrodes of some transistors in the shift register unit 10 are coupled to the first node Q and/or the control node H, and second electrodes of these transistors are coupled to low-level signal lines. Even in a case where gate electrodes of these transistors receive turn-off signals, a leakage phenomenon may occur due to a voltage difference between the first electrodes and second electrodes of these transistors, thereby deteriorating the maintenance effect on the potential of the first node Q and/or the potential of the control node H. Therefore, the shift register unit 10 as shown in FIG. 7 adds a plurality of leakage prevention circuits to ameliorate the maintenance effect on the potential of the first node Q and/or the potential of the control node H.

For example, as shown in FIG. 7, a first leakage prevention circuit may include a first leakage prevention transistor M5b and a second leakage prevention transistor M21, and is configured to, in a case where the control node H is at a high level, prevent electric charges at the control node H from leaking to the second input signal terminal STU2 via the fifth transistor M5a. A gate electrode of the first leakage prevention transistor M5b is coupled to a gate electrode of the fifth transistor M5a (i.e., the gate electrode of the first leakage prevention transistor M5b is coupled to the second clock signal terminal CLKB), a first electrode of the first leakage prevention transistor M5b is coupled to a second electrode of the fifth transistor M5a, and a second electrode of the first leakage prevention transistor M5b is coupled to the control node H. A gate electrode of the second leakage prevention transistor M21 is coupled to the control node H, a first electrode of the second leakage prevention transistor M21 is coupled to the second voltage terminal VDD, and a second electrode of the second leakage prevention transistor M21 is coupled to the first electrode of the first leakage prevention transistor M5b.

For example, in a case where the control node H is at a high level, the second leakage prevention transistor M21 is turned on under control of the control node H, and a second voltage (high voltage) is written to the first electrode of the first leakage prevention transistor M5b, so that both the first electrode of the first leakage prevention transistor M5b and the second electrode of the first leakage prevention transistor M5b are in a high-level state to prevent the electric charges at the control node H from leaking through the first leakage prevention transistor M5b. In this case, because the gate electrode of the fifth transistor M5a is coupled to the gate electrode of the first leakage prevention transistor M5b, the combination of the first leakage prevention transistor M5b and the fifth transistor M5a can achieve the same function as the aforementioned fifth transistor M5 and has the leakage prevention effect at the same time.

Similarly, for the second transistor M2, the seventh transistor M7, the eleventh transistor M11, and the twelfth transistor M12, which are coupled to the first node Q, the same leakage prevention circuits having the same principle as the aforementioned leakage prevention circuit can also be adopted to achieve the leakage prevention effect. For example, the second leakage prevention circuit may include a third leakage prevention transistor M2b, a fourth leakage prevention transistor M7b, a fifth leakage prevention transistor M11b, a sixth leakage prevention transistor M12b, and a seventh leakage prevention transistor M20. The connection mode and working principle of the second leakage prevention circuit are similar to those of the above-mentioned first leakage prevention circuit and will not be repeated herein again.

For example, in a case where the first node Q is at a high level, the seventh leakage prevention transistor M20 is turned on, and a leakage prevention node OFF is at a high level, so that a first electrode and a second electrode of each of the third leakage prevention transistor M2b, the fourth leakage prevention transistor M7b, the fifth leakage prevention transistor M11b, and the sixth leakage prevention transistor M12b are all in a high level state, to prevent the electric charges of the first node Q from leaking. In this case, the combination of the third leakage prevention transistor M2b and the second transistor M2a can achieve the same function as the aforementioned second transistor M2, the combination of the fourth leakage prevention transistor M7b and the seventh transistor M7a can achieve the same function as the aforementioned seventh transistor M7, the combination of the fifth leakage prevention transistor M11b and the eleventh transistor M11a can achieve the same function as the aforementioned eleventh transistor M11, the combination of the sixth leakage prevention transistor M12b and the twelfth transistor M12a can achieve the same function as the aforementioned twelfth transistor M12, and the shift register unit 10 as shown in FIG. 7 has a leakage prevention effect.

It should be noted that those skilled in the art can understand that according to the embodiment of the circuit having the leakage prevention function provided by the embodiments of the present disclosure, one or more transistors in the shift register unit 10 can be selected according to the actual situation to add a leakage prevention circuit structure. FIG. 7 shows only one exemplary circuit structure including a leakage prevention circuit and does not constitute a limitation to the embodiments of the present disclosure.

It is worth noting that in the description of various embodiments of the present disclosure, the first node Q, the second node QB, the control node H, the leakage prevention node OFF, and the like do not indicate that they are actual components, but indicate junction points of related electrical connections in the circuit diagram.

It should be noted that the transistors used in the embodiments of the present disclosure may all be thin film transistors, field effect transistors, or other switching devices with the like characteristics, and the embodiments of the present disclosure can be described by taking the thin film transistors as an example. A source electrode and a drain electrode of each transistor used here can be symmetrical in structure, so the source electrode and the drain electrode of the transistor may have no difference in structure. In the embodiments of the present disclosure, in order to distinguish two electrodes of a transistor except a gate electrode, one of the two electrodes is referred to as a first electrode described directly, and the other of the two electrodes is referred to as a second electrode.

In addition, the transistors in the embodiments of the present disclosure are all described by taking N-type transistors as an example. In this case, a first electrode of each transistor is a drain electrode, and a second electrode of each transistor is a source electrode. It should be noted that the present disclosure includes but is not limited to this case. For example, one or more transistors in the shift register unit 10 provided by the embodiment of the present disclosure may also adopt P-type transistors. In this case, a first electrode of each transistor is a source electrode, a second electrode of each transistor is a drain electrode, and as long as respective electrodes of a selected-type transistor are correspondingly connected in accordance with respective electrodes of a corresponding transistor in the embodiment of the present disclosure. In a case where an N-type transistor is used, Indium Gallium Zinc Oxide (IGZO) can be used as an active layer of the thin film transistor, which may effectively reduce the size of the transistor and prevent leakage current compared with using Low Temperature Poly Silicon (LTPS) or amorphous silicon (such as hydrogenated amorphous silicon) as the active layer of the thin film transistor.

Figure 8:
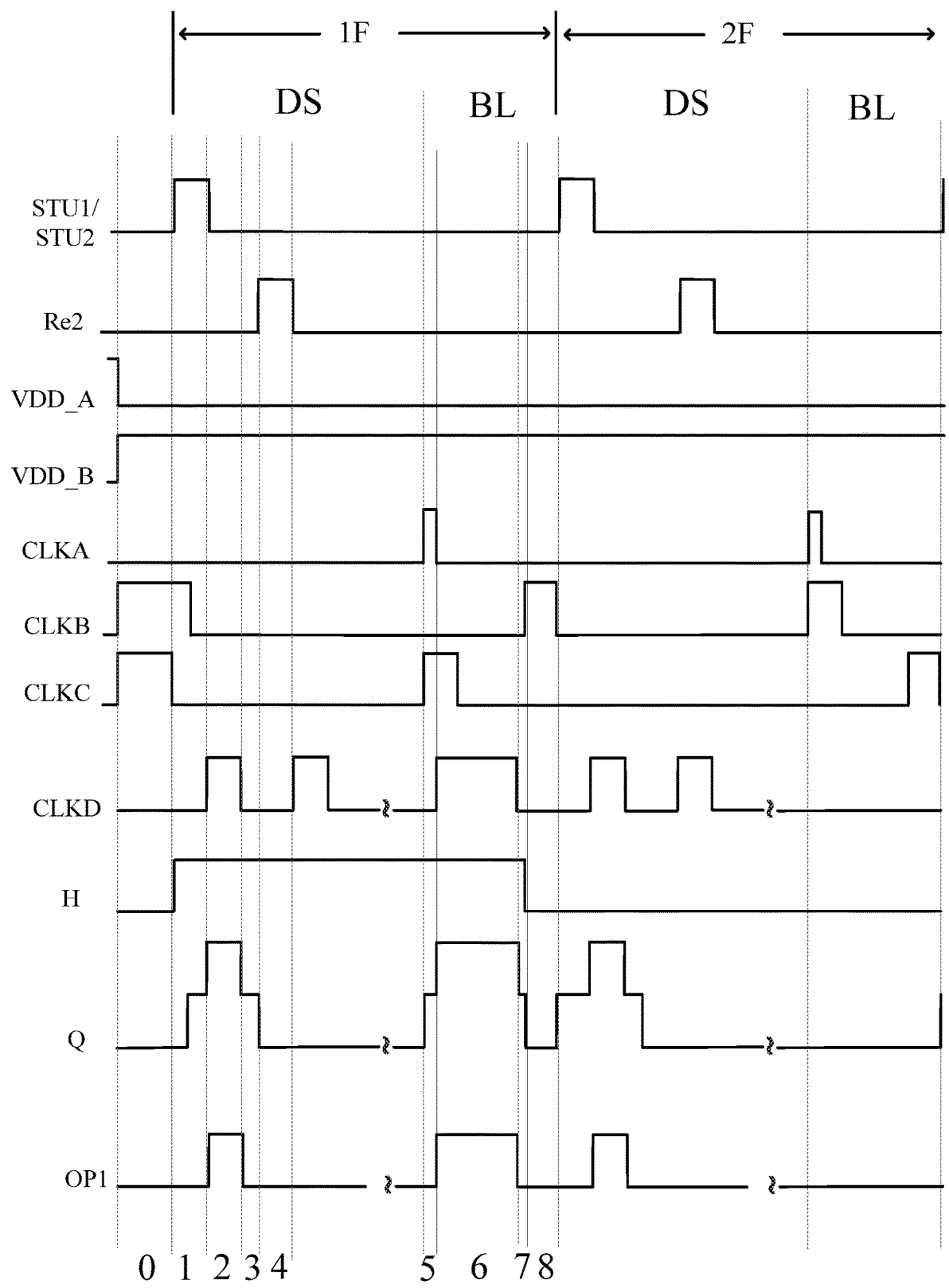
FIG. 8 is a signal timing diagram of a shift register unit provided by some embodiments of the present disclosure.

FIG. 8 is a signal timing diagram of a shift register unit provided by some embodiments of the present disclosure. The operation principle of the shift register unit 10 as shown in FIG. 6 will be described below with reference to the signal timing chart as shown in FIG. 8, and is described by taking a case that each transistor is an N-type transistor as an example herein, but the embodiment of the present disclosure is not limited thereto.

In FIG. 8 and the following description, 1F and 2F represent the timing of a first frame and the timing of a second frame, respectively. DS represents a display phase of one frame, BL represents a blanking phase of one frame. STU1, STU2, Con2, VDD_A, VDD_B, CLKA, CLKB, CLKC, CLKD, Ot, CR, etc. are not only used to represent corresponding signal terminals, but also used to represent corresponding signals. The following embodiments are the same as those described herein, and the repeated descriptions will not be described again.

In an initial phase 0, the second clock signal CLKB is at a high level, the second input signal STU2 is at a low level, the eleventh transistor M11 is turned on to write the first voltage of the first voltage terminal VGL1 to the first node Q to reset the first node Q, and the fifth transistor M5 is turned on to write the second input signal STU2 to the control node H to reset the control node H.

In the display phase DS, in a first phase 1, the first input signal STU1, the second input signal STU2, the second clock signal CLKB, and the fifth voltage VDD_B are all at high levels. The fifth transistor M5 and the first transistor M1 are both turned on, the second input signal STU2 is written to the control node H via the fifth transistor M5 and stored by the second capacitor C2, and the second voltage (high level) is written to the first node Q via the first transistor M1 to pull the first node Q up to the high level. For example, the first input signal STU1 is input to the fourth control signal terminal Con2 as the fourth control signal. The sixteenth transistor M16 is turned on, and the second node QB is pulled down to a low level. The ninth transistor M9 and the tenth transistor M10 are both turned on, and the second node QB is also pulled down to a low level. Because the first node Q is at a high level, the first output transistor M15 and the second output transistor M13 are turned on to output the output clock signal CLKD to the first signal output terminal OP1 and the second signal output terminal CR. Because the output clock signal CLKD is at a low level, both the first signal output terminal OP1 and the second signal output terminal CR output a low level.

It should be noted that in the first phase 1, the second capacitor C2 stores the second input signal STU2 with a high level and maintains the second input signal STU2 with the high level until the end of the display phase of one frame for use in the blanking phase.

For example, in a second phase 2, the first node Q is kept at the high level, and the first output transistor M15 and the second output transistor M13 are kept to be turned on. The output clock signal CLKD becomes a high level. Due to the bootstrap effect of the first capacitor C1, the potential of the first node Q is further increased, the first output transistor M15 and the second output transistor M13 are more fully turned on, and the high level of the output clock signal CLKD is output to the first signal output terminal OP1 and the second signal output terminal CR.

For example, in a third phase 3, the output clock signal CLKD becomes to be at a low level. Due to the bootstrap effect of the first capacitor C1, the potential of the first node Q is lowered but kept to be at a high level, the first output transistor M15 and the second output transistor M13 are still kept to be turned on, and the low level of the output clock signal CLKD is output to the first signal output terminal OP1 and the second signal output terminal CR to achieve the reset of the output terminal Ot.

For example, in a fourth phase 4, the second reset control signal Re2 is at a high level, the twelfth transistor M12 is turned on, so that the first voltage of the first voltage terminal VGL1 is written to the first node Q to reset the first node Q. For example, in the example as shown in FIG. 6, in a case where the shift register unit operates for a long time, the threshold voltage of the transistor in the circuit is easy to drift, for example, positively drift. In a case where the threshold voltage of the third transistor M3 and the threshold voltage of the fourth transistor M4 are positively drift by a large degree, the first signal output terminal OP1 and the second signal output terminal CR generate noise signals, and the level of the first node Q becomes a low level. However, the low-level signals output by the first signal output terminal OP1 and the second signal output terminal CR deviate from a predetermined value, there is a voltage difference between the first signal output terminal OP1 and the first node Q, there is also a voltage difference between the second signal output terminal CR and the first node Q, both the level of the first signal output terminal OP1 and the level of the second signal output terminal CR are higher than the level of the first node Q, so that the first noise reduction transistor M18 and the second noise reduction transistor M17 are turned on. The level of the first signal output terminal OP1 can be pulled down by the first noise reduction transistor M18, and the level of the second signal output terminal CR can be pulled down by the second noise reduction transistor M17, so that the first sub-output signal output by the first signal output terminal OP1 reaches a predetermined value, the second sub-output signal output by the second signal output terminal CR also reaches a predetermined value, and the noise signals of the first signal output terminal OP1 and the second signal output terminal CR are eliminated.

For example, in the fourth phase 4, the level of the first node Q becomes a low level, so that the tenth transistor M10 is turned off, for example, the eighth transistor M8 is turned off, and the ninth transistor M9 is turned on, so that the fifth voltage at the fifth voltage terminal VDD_B is written to the second node QB, and the second node QB is pulled up to a high level, so that the second transistor M2 is turned on to further perform noise reduction on the first node Q. The third transistor M3 and the fourth transistor M4 are also turned on under control of the high level of the second node QB, thereby performing noise reduction on the first signal output terminal OP1 and the second signal output terminal CR.

For example, in the above-mentioned various phases, because the first clock signal CLKA is always kept at a low level, the seventh transistor M7 is in a turned-off state, thereby isolating the control node H and the first node Q to prevent the level of the control node H from affecting the output signal in the display phase. As shown in FIG. 8, the level of the first node Q presents a tower-shaped waveform, the pulling-up and the resetting of the output signal of the first signal output terminal OP1 are achieved by the first output transistor M15, and the pulling-up and resetting of the output signal of the second signal output terminal CR are achieved by the second output transistor M13. The third transistor M3 and the fourth transistor M4 play auxiliary pulling-down roles on the output signal of the first signal output terminal OP1 and the output signal of the second signal output terminal CR, respectively, so that a volume of the third transistor M3 and a volume of the fourth transistor M4 can be reduced, which is beneficial to reducing the area of the circuit layout. The first noise reduction transistor M18 and the second noise reduction transistor M17 are used to achieve to perform noise reduction on the first signal output terminal OP1 and the second signal output terminal CR, thereby preventing noise problems caused by threshold voltage drift of the third transistor M3 and the fourth transistor M4 and enhancing the reliability of the circuit.

For example, in the blanking phase BL, in a fifth phase 5, the first clock signal CLKA, the third clock signal CLKC, and the fifth voltage VDD_B are at a high level. The control node H is kept at a high level, and the sixth transistor M6 is turned on. Because the first clock signal CLKA is at a high level, the seventh transistor M7 is turned on, so that the third clock signal CLKC is written to the first node Q to pull up the first node Q to a high level, that is, the level of the first node Q is a high level. The fourteenth transistor M14 is also turned on, and the first voltage at the first voltage terminal VGL1 is written to the second node QB to pull down the second node QB to a low level. The ninth transistor M9 and the tenth transistor M10 are both turned on, and the second node QB is also pulled down to a low level. Because the first node Q is at a high level, the first output transistor M15 and the second output transistor M13 are turned on to output the output clock signal CLKD to the first signal output terminal OP1 and the second signal output terminal CR. Because the output clock signal CLKD is at a low level, both the first signal output terminal OP1 and the second signal output terminal CR output low-level signals.

For example, in a sixth phase 6, the first clock signal CLKA becomes a low level, and the seventh transistor M7 is turned off, so that the first node Q does not leak through the seventh transistor M7. At this time, the fourteenth transistor M14 is also turned off. The first output transistor M15 and the second output transistor M13 continues to be turned on. In a case where the output clock signal CLKD becomes to be a high level, the potential of the first node Q is further increased due to the bootstrap effect of the first capacitor C1, the first output transistor M15 and the second output transistor M13 are more fully turned on, and the high level of the output clock signal CLKD is output to the first signal output terminal OP1 and the second signal output terminal CR.

For example, in a seventh phase 7, the output clock signal CLKD becomes to be a low level. Due to the bootstrap effect of the first capacitor C1, the potential of the first node Q is decreased but still kept to be a high level, the first output transistor M15 and the second output transistor M13 still continues to be turned on, and the low level of the output clock signal CLKD is output to the first signal output terminal OP1 and the second signal output terminal CR to complete the reset of the output terminal Ot.

For example, in an eighth phase 8 (a last phase of the blanking phase BL), the second clock signal CLKB is at a high level, and the eleventh transistor M11 is turned on, so that the first voltage of the first voltage terminal VGL1 is written to the first node Q to reset the first node Q. For example, in a case where the shift register unit operates for a long time, the threshold voltage of the third transistor M3 and the threshold voltage of the fourth transistor M4, for example, drafts positively, the first signal output terminal OP1 and the second signal output terminal CR generate noise signals, and the noise signals cannot be eliminated in time, the output terminal Ot generates noise ripples, and the level of the first node Q becomes a low level. Because the low-level signal output by the first signal output terminal OP1 and the low-level signal output by the second signal output terminal CR deviate from a predetermined value, there is a voltage difference between the first signal output terminal OP1 and the first node Q, and there is also a voltage difference between the second signal output terminal CR and the first node Q, so that the first noise reduction transistor M18 and the second noise reduction transistor M17 are turned on, so the level of the first signal output terminal OP1 can be pulled down by the first noise reduction transistor M18, the level of the second signal output terminal CR can be pulled down through the second noise reduction transistor M17, thereby eliminating the noise signals of the first signal output terminal OP1 and the second signal output terminal CR.

For example, in the eighth phase 8, the second clock signal CLKB is at a high level, the fifth transistor M5 is turned on, the second input signal STU2 is at a low level, and the second input signal STU2 is written to the control node H to reset the control node H. In this way, the control node H can be kept at a high level for a relatively short period of time to reduce the risk of threshold voltage drift (e.g., positive drift) of the transistor coupled to the control node H, which is beneficial to improving the reliability of the circuit.

It should be noted that, in this embodiment, the fourteenth transistor M14 can improve the high-level writing ability of the first node Q during the blanking phase BL, and the sixteenth transistor M16 can improve the high-level writing ability of the first node Q during the display phase DS, thus preventing the threshold voltage drift (e.g., positive drift) of the transistors in the circuit from affecting the output signal and enhancing the reliability of the circuit. In the timing of each frame, the fourteenth transistor M14 and the sixteenth transistor M16 each is turned on during a turn-on time period, and the positive drift phenomenon of the transistor coupled to the second node QB can be alleviated during the turn-on time period.

It should be noted that in the embodiments of the present disclosure, for example, in a case where each circuit is implemented as an N-type transistor, the term "pull-up" means charging a node or an electrode of a transistor so as to raise an absolute value of a level of the node or a level of the electrode, thereby implementing an operation (e.g., turn-on) of a corresponding transistor; the term "pull-down" means discharging a node or an electrode of a transistor so that an absolute value of a level of the node or the electrode is decreased, thereby implementing an operation (e.g., turn-off) of the corresponding transistor. The term "operation potential" represents that a node is at a high potential, so that in a case where a gate electrode of a transistor is coupled to the node, the transistor is turned on; the term "non-operation potential" represents that a node is at a low potential, so that in a case where a gate electrode of a transistor is coupled to the node, the transistor is turned off. For another example, in a case where each circuit is implemented as a P-type transistor, the term "pull-up" means discharging a node or an electrode of a transistor, so that an absolute value of a level of the node or the electrode is decreased, thereby achieving an operation (e.g., turn-on) of a corresponding transistor; and the term "pull-down" means charging a node or an electrode of a transistor, so that an absolute value of a level of the node or the electrode is increased, thereby achieving an operation (e.g., turn-off) of a corresponding transistor. The term "operation potential" represents that a node is at a low potential, so that in a case where a gate electrode of a transistor is coupled to the node, the transistor is turned on; and the term "non-operation potential" represents that a node is at a high potential, so that in a case where a gate electrode of a transistor is coupled to the node, the transistor is turned off.

At least some embodiments of the present disclosure also provide a gate drive circuit. The gate drive circuit includes the shift register unit according to any one of the embodiments of the present disclosure. The gate drive circuit has a simple circuit structure, can prevent the output signal from being affected after the threshold voltage of the transistor drifts, can eliminate the noise problem of the output terminal caused by long-term operation of the gate drive circuit, and can enhance the reliability of the circuit.

Figure 9:
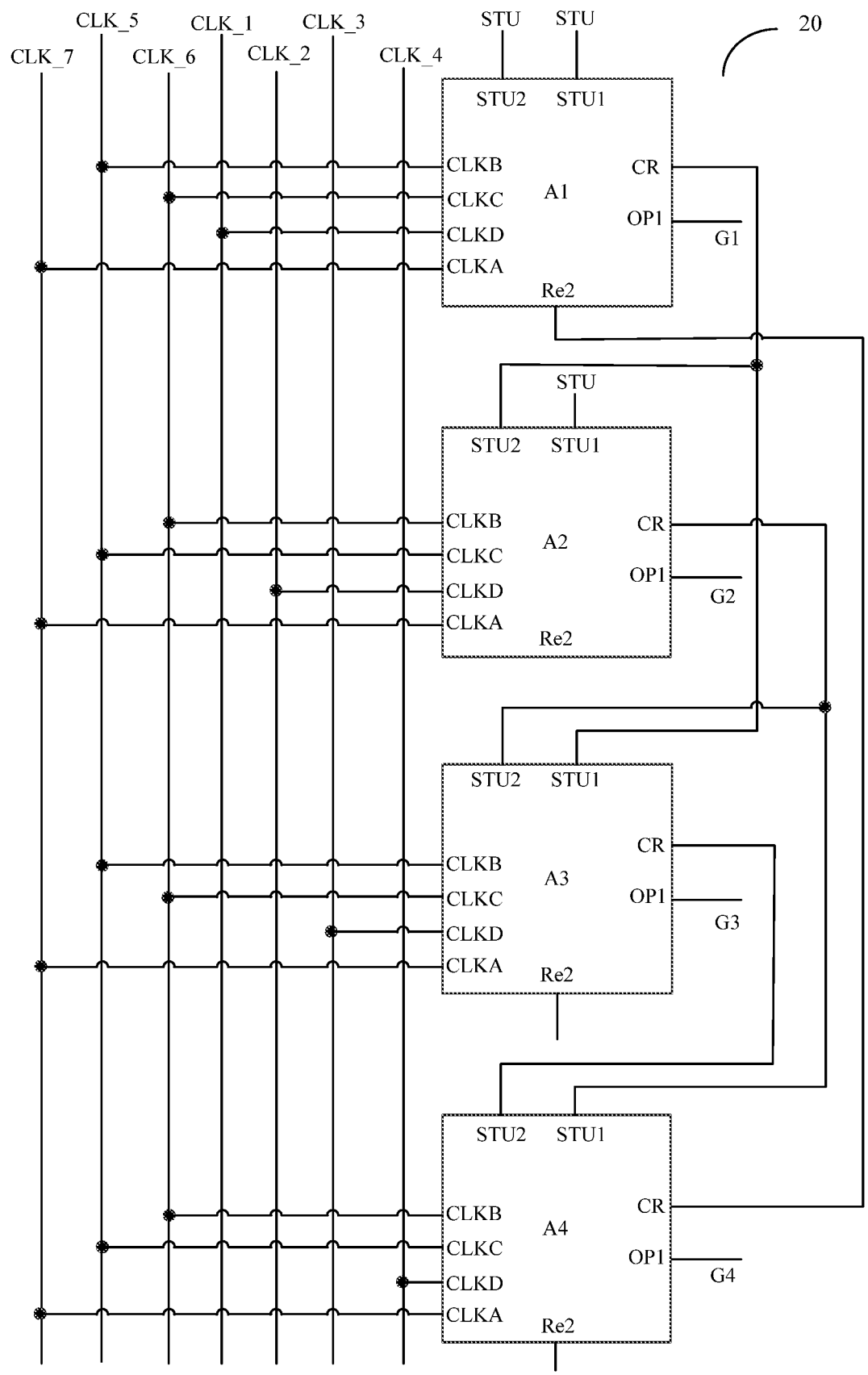
FIG. 9 is a schematic diagram of a gate drive circuit according to some embodiments of the present disclosure.

FIG. 9 is a schematic diagram of a gate drive circuit according to some embodiments of the present disclosure. For example, as shown in FIG. 9, a gate drive circuit 20 includes a plurality of cascaded shift register units (e.g., A1, A2, A3, A4, etc.). The number of the plurality of shift register units is not limited and can be determined according to actual requirements. For example, the shift register unit may adopt the shift register unit 10 described in any one of the embodiments of the present disclosure. For example, in the gate drive circuit 20, some or all of the shift register units may adopt the shift register unit 10 described in any one of the embodiments of the present disclosure. For example, the gate drive circuit 20 can be directly integrated on an array substrate of the display device using a process similar to that of the thin film transistor to achieve the progressive scan drive function. The first signal output terminals OP1 of these shift register units are respectively coupled to a plurality of gate lines (e.g., G1, G2, G3, G4, etc.) in one-to-one correspondence manner.

For example, each shift register unit has a first input signal terminal STU1, a second input signal terminal STU2, a first clock signal terminal CLKA, a second clock signal terminal CLKB, a third clock signal terminal CLKC, an output clock signal terminal CLKD, a second reset control signal terminal Re2, a first signal output terminal OP1, a second signal output terminal CR, and the like.

For example, as shown in FIG. 9, in some examples, a first input signal terminal STU1 and a second input signal terminal STU2 of a first stage shift register unit A1, and a first input signal terminal STU1 of a second stage shift register unit A2 are all coupled to an input signal line STU, for example, to receive a trigger signal STV. In addition to the first stage shift register unit A1, a second input signal terminal STU2 of an (m+1)-th stage shift register unit (e.g., a second stage shift register unit A2) is coupled to a second signal output terminal CR of an (m)-th stage shift register unit (e.g., the first stage shift register unit A1). In addition to the first stage shift register unit A1 and the second stage shift register unit A2, a first input signal terminal STU1 of an (m+2)-th stage shift register unit (e.g., a third stage shift register unit A3) is coupled to the second signal output terminal CR of the (m)-th stage shift register unit (e.g., the first stage shift register unit A1). Except for last three stages of shift register units, a second reset control signal terminal Re2 of the (m)-th stage shift register unit (e.g., the first stage shift register unit A1) is coupled to a second signal output terminal CR of an (m+3)-th stage shift register unit (e.g., a fourth stage shift register unit A4), and m is an integer greater than 0.

For example, the gate drive circuit 20 further includes a first sub-clock signal line CLK_1, a second sub-clock signal line CLK_2, a third sub-clock signal line CLK_3, and a fourth sub-clock signal line CLK_4. The connection mode in which each stage shift register unit is coupled to the above respective sub-clock signal lines is as follows and so on.

For example, as shown in FIG. 9, an output clock signal terminal CLKD of a (4n−3)-th stage shift register unit (e.g., the first stage shift register unit A1) is coupled to the first sub-clock signal line CLK_1; an output clock signal terminal CLKD of a (4n−2)-th stage shift register unit (e.g., the second stage shift register unit A2) is coupled to the second sub-clock signal line CLK_2; an output clock signal terminal of a (4n−1)-th stage shift register unit (e.g., the third stage shift register unit A3) is coupled to the third sub-clock signal line CLK_3; an output clock signal terminal of a (4n)-th stage shift register unit (e.g., the fourth stage shift register unit A4) is coupled to the fourth sub-clock signal line CLK_4; and n is an integer greater than 0.

For example, as shown in FIG. 9, the gate drive circuit 20 further includes a fifth sub-clock signal line CLK_5 and a sixth sub-clock signal line CLK_6. The connection mode in which each shift register unit is coupled to the above respective sub-clock signal lines is as follows and so on.

For example, a second clock signal terminal CLKB of a (2n−1)-th stage shift register unit (for example, the first stage shift register unit A1 and the third stage shift register unit A3) is coupled to the fifth sub-clock signal line CLK_5, and a third clock signal terminal CLKC of the (2n−1)-th stage shift register unit is coupled to the sixth sub-clock signal line CLK_6. A second clock signal terminal CLKB of a (2n)-th stage shift register unit (for example, the second stage shift register unit A2 and the fourth stage shift register unit A4) is coupled to the sixth sub-clock signal line CLK_6, a third clock signal terminal CLKC of the (2n)-th stage shift register unit is coupled to the fifth sub-clock signal line CLK_5, and n is an integer greater than 0.

For example, as shown in FIG. 9, the gate drive circuit 20 further includes a seventh sub-clock signal line CLK_7, and the seventh sub-clock signal line CLK_7 is configured to be coupled to first clock signal terminals CLKA of respective stages of shift register units (e.g., the first stage shift register unit A1, the second stage shift register unit A2, the third stage shift register unit A3, and the fourth stage shift register unit A4).

For example, the gate drive circuit 20 may further include a timing controller T-CON, for example, the timing controller T-CON is configured to provide the above-mentioned respective clock signals to respective stages of shift register units, and the timing controller T-CON may also be configured to provide the trigger signal and the reset control signal. It should be noted that the phase relationship among a plurality of clock signals provided by the timing controller T-CON can be determined according to actual requirements. In different examples, more clock signals can be provided according to different configurations. For example, the gate drive circuit 20 further includes a plurality of voltage lines to provide a plurality of voltage signals to each shift register unit.

For example, in a case where the gate drive circuit 20 is used to drive a display panel, the gate drive circuit 20 may be disposed on one side of the display panel. For example, the display panel includes a plurality of gate lines (e.g., G1, G2, G3, G4, etc.), and the first signal output terminals OP1 of respective stages of shift register units in the gate drive circuit 20 may be configured to be coupled in one-to-one correspondence to the plurality of gate lines for outputting scanning drive signals to the plurality of gate lines. Of course, the gate drive circuits 20 may also be disposed on both sides of the display panel to achieve bilateral drive. The embodiments of the present disclosure does not limit the manner in which the gate drive circuit 20 is disposed. For example, a gate drive circuit 20 may be disposed on one side of the display panel for driving odd-row gate lines, while a gate drive circuit 20 may be disposed on the other side of the display panel for driving even-row gate lines.

Figure 10:
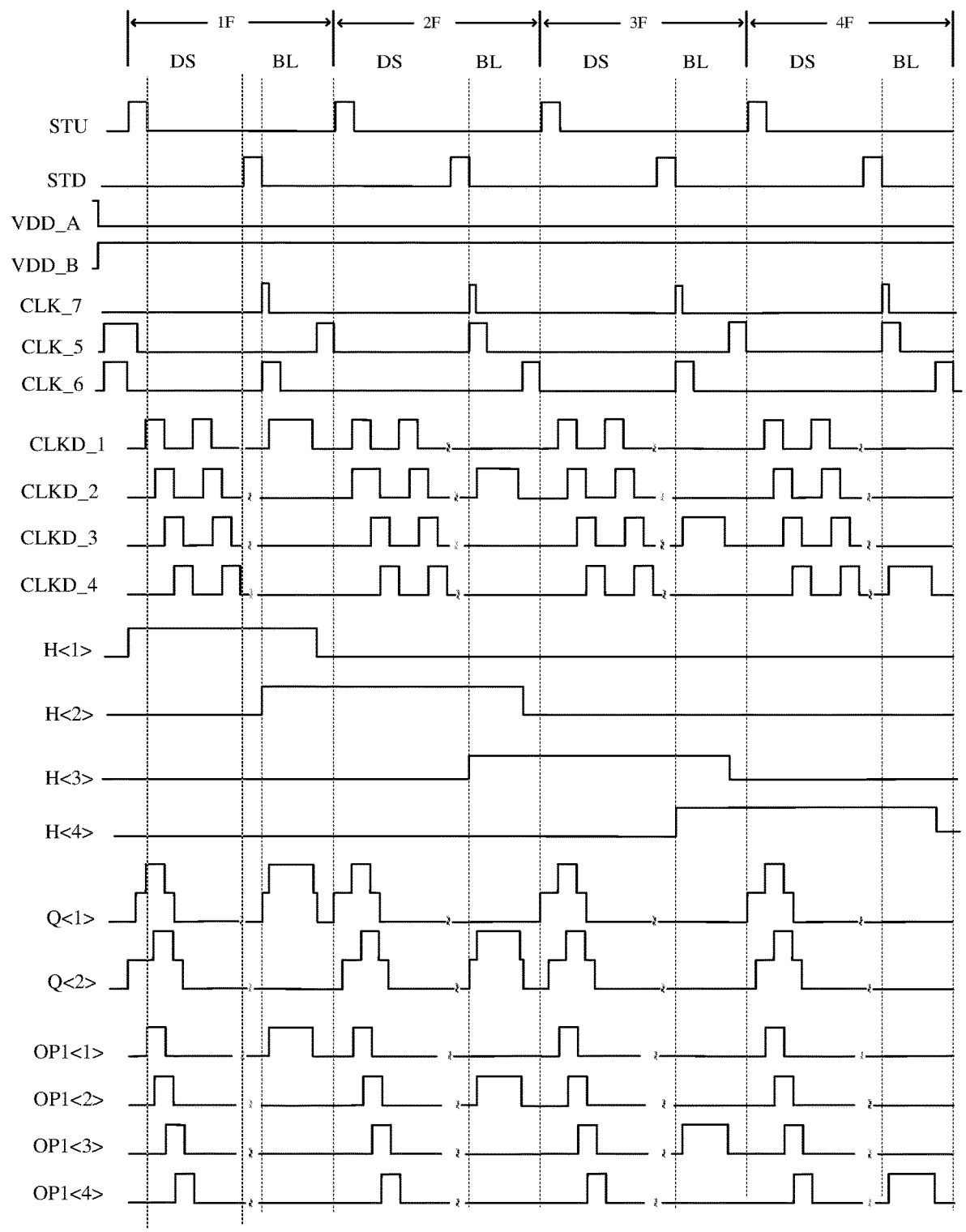
FIG. 10 is a signal timing diagram of a gate drive circuit according to some embodiments of the present disclosure.

FIG. 10 is a signal timing diagram of a gate drive circuit provided by some embodiments of the present disclosure. The signal timing diagram is a timing diagram of the gate drive circuit 20 as shown in FIG. 9, and the shift register unit in the gate drive circuit 20 is the shift register unit 10 as shown in FIG. 6. The operation principle of the gate drive circuit 20 can be referred to the corresponding description of the shift register unit 10 in the embodiments of the present disclosure, and the repeated portions are not described here again.

It should be noted that in FIG. 10, Q<1> and Q<2> respectively represent a first node Q in the first stage shift register unit and a first node Q in the second stage shift register unit in the gate drive circuit 20. OP1<1>, OP1<2>, OP1<3>, and OP1<4> respectively represent a first signal output terminal OP1 in the first stage shift register unit, a first signal output terminal OP1 in the second stage shift register unit, a first signal output terminal OP1 in the third stage shift register unit, and a first signal output terminal OP1 in the fourth stage shift register unit in the gate drive circuit 20. 1F, 2F, 3F, and 4F represent the first frame, the second frame, a third frame, and a fourth frame, respectively. DS represents a display phase in one frame, and BL represents a blanking phase in one frame. It should be noted that because the potential of the first signal output terminal OP1 and the potential of the second signal output terminal CR in each stage shift register unit are the same, the second signal output terminal CR is not shown in FIG. 10. It should be noted that the signal levels in the signal timing diagram as shown in FIG. 10 are only schematic and does not represent true level values.

For example, in the display phase DS, the shift register unit 10 outputs scanning drive signals line by line to the plurality of gate lines until a scanning drive signal is output to a last gate line of the plurality of gate lines, thereby completing the display of one frame. In the blanking phase BL, a second signal output terminal CR of a (n)-th stage shift register unit 10 outputs a high level signal, and the high level signal is input to a second input signal terminal STU2 as a second input signal of an (n+1)-th stage shift register unit 10 to charge a control node H of the (n+1)-th stage shift register unit 10, so that a second signal output terminal CR of the (n+1)-th stage shift register unit 10 outputs a high level signal in a blanking phase BL of a next frame.

For example, as shown in FIG. 10, in some examples, in a blanking phase BL of the first frame 1F, the second sub-output signal output by the second signal output terminal CR of the first stage shift register unit A1 (i.e., the first sub-output signal output by the first signal output terminal OP1<1> of the first stage shift register unit A1) is a high level signal; and in a blanking phase BL of the second frame 2F, the second sub-output signal output by the second signal output terminal CR of the second stage shift register unit A2 (i.e., the first sub-output signal output by the first signal output terminal OP1<2> of the second stage shift register unit A2) is a high level signal, and so on.

For example, a second clock signal terminal CLKB of an odd-numbered stage shift register unit 10 is coupled to the fifth sub-clock signal line CLK_5, and a second clock signal terminal CLKB of an even-numbered stage shift register unit 10 is coupled to the sixth sub-clock signal line CLK_6. As shown in FIG. 10, the fifth sub-clock signal CLK_5 and the sixth sub-clock signal CLK_6 alternate to be at a high level at an end of the blanking phase of each frame, so that the fifth sub-clock signal CLK_5 inputs a high level to the second clock signal terminal CLKB of the odd-numbered stage shift register unit 10 in a blanking phase of an odd frame, and in a blanking phase of an even frame, the sixth sub-clock signal CLK_6 inputs a high level to the second clock signal terminal CLKB of the even-numbered stage shift register unit 10, thereby alternately resetting a control node H and a first node Q of the shift register unit 10 in the odd-numbered stage and a control node H and a first node Q of the shift register unit 10 in the even-numbered stage. In a case where the second clock signal terminal CLKB of the (n)-th stage shift register unit 10 is at a high level, a third clock signal terminal CLKC of a (n+1)-th stage shift register unit 10 is at a high level. Because the first clock signal terminal CLKA is at a low level, the seventh transistor M7 is turned off, so that a high level cannot be erroneously written into a first node Q of the (n+1)-th stage shift register unit 10 due to the high level of the third clock signal terminal CLKC, and the abnormal output is avoided.

For example, as shown in FIG. 10, waveforms of the first sub-clock signal CLK_1, the second sub-clock signal CLK_2, the third sub-clock signal CLK_3, and the fourth sub-clock signal CLK_4 in the display phase of one frame are sequentially overlapped by 50% of an effective pulse width, and the waveforms in the blanking phase of each frame are sequentially shifted. Thus, the waveforms of the output signals OP1<1>, OP1<2>, OP1<3> and OP1<4> of the first signal output terminals OP1 of the first stage to fourth stage of shift register units A1-A4 in the display phase of one frame are sequentially overlapped by 50% of the effective pulse width, and the waveforms in the blanking phase of each frame are sequentially shifted. The output signals of the gate drive circuit 20 overlap during the display phase, so that the pre-charging function can be achieved, the charging time of the pixel circuit can be shortened, and the high refresh rate can be achieved.

It should be noted that in various embodiments of the present disclosure, the gate drive circuit 20 is not limited to a cascade mode described in FIG. 9, but may be any suitable cascade mode. In a case where the cascade mode or the clock signal changes, the waveform overlapping portions of the output signals OP1<1>, OP1<2>, OP1<3> and OP1<4> of the first signal output terminals OP1 of the first stage to fourth stage of shift register units A1-A4 in the display phase also change correspondingly, for example, overlapping by 33% or 0% (i.e., not overlapping), so as to meet various application requirements.

At least some embodiments of the present disclosure also provide a display device. The display device includes the gate drive circuit according to any one of embodiments of the present disclosure. The circuit structure of the gate drive circuit in the display device is simple, the output signal can be prevented from being influenced after the threshold voltage of the transistor drifts, the noise problem at the output terminal caused by long time operation of the gate drive circuit is eliminated, and the reliability of the circuit is enhanced.

Figure 11:
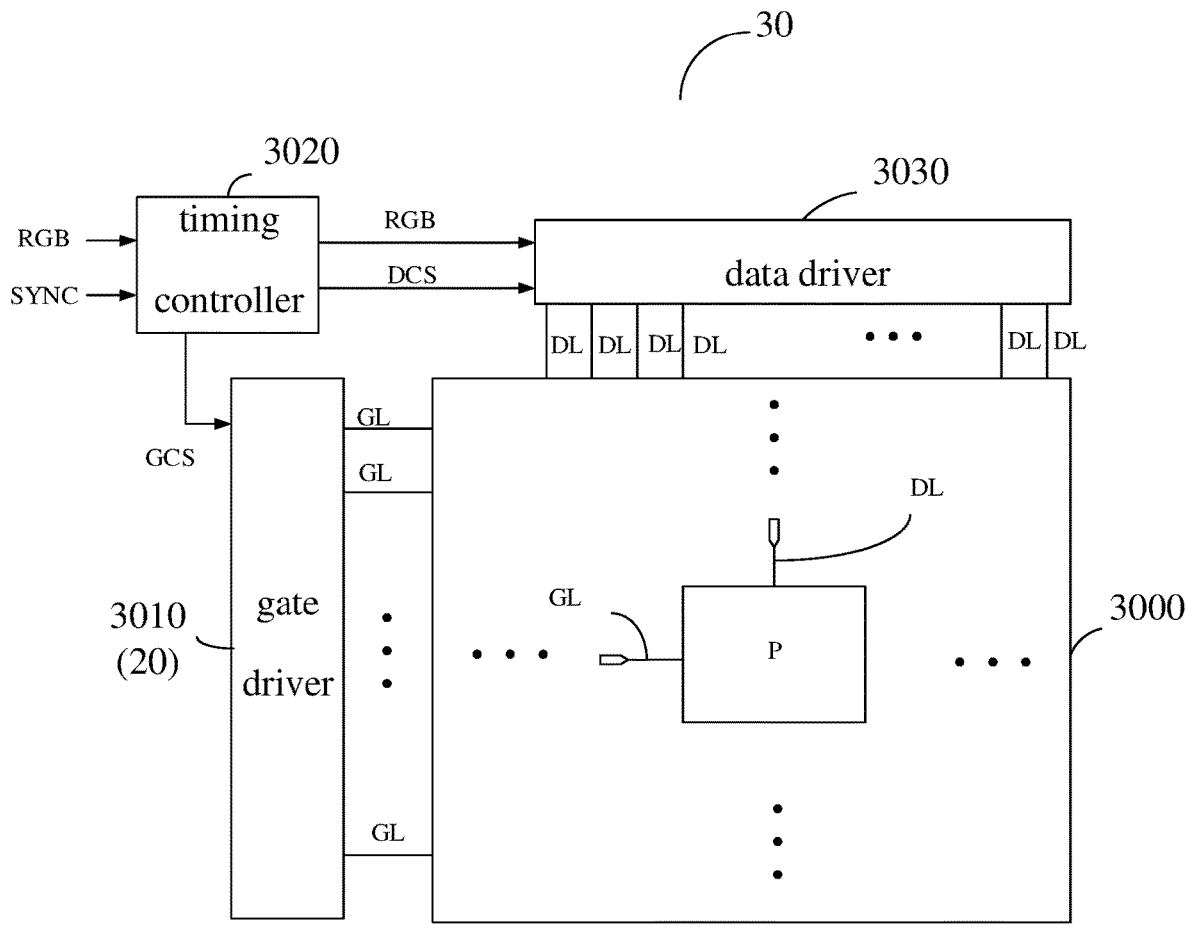
FIG. 11 is a schematic block diagram of a display device provided by some embodiments of the present disclosure.

FIG. 11 is a schematic block diagram of a display device provided by some embodiments of the present disclosure. For example, as shown in FIG. 11, a display device 30 includes a gate drive circuit 20, and the gate drive circuit 20 is the gate drive circuit according to any one of embodiments of the present disclosure. For the technical effects of the display device 30, reference can be made to the corresponding descriptions of the shift register unit 10 and the gate drive circuit 20 in the above embodiment, and details are not described again here.

For example, in an example, the display device 30 further includes a display panel 3000, a gate driver 3010, a timing controller 3020, and a data driver 3030. The display panel 3000 includes a plurality of pixel units P defined by a plurality of gate lines GL and a plurality of data lines DL crossing each other. The gate driver 3010 is used to drive the plurality of gate lines GL; the data driver 3030 is used to drive the plurality of data lines DL; the timing controller 3020 is used to process image data RGB input from the outside of the display device 30, provide the image data RGB, which is processed, to the data driver 3030, and output scanning control signals GCS and data control signals DCS to the gate driver 3010 and the data driver 3030 to control the gate driver 3010 and the data driver 3030.

For example, the gate driver 3010 includes the gate drive circuit 20 provided in any one of the above embodiments. The first signal output terminals OP1 of the plurality of shift register units 10 in the gate drive circuit 20 are correspondingly coupled to the plurality of gate lines GL. The first signal output terminals OP1 of respective shift register units 10 in the gate drive circuit 20 sequentially output scanning drive signals to the plurality of gate lines GL, so as to achieve to perform progressive or interlaced scanning on the plurality of rows of pixel units P in the display panel 3000 in the display phase and achieve compensation detection in the blanking phase. For example, the gate driver 3010 may be implemented as a semiconductor chip or may be integrated in the display panel 3000 to constitute a GOA circuit.

For example, the data driver 3030 provides data signals, which are converted, to the plurality of data lines DL. For example, the data driver 3030 may be implemented as a semiconductor chip.

For example, the timing controller 3020 processes the image data RGB input from the outside to match a size and resolution of the display panel 3000, and then supplies the image data, which is processed, to the data driver 3030. The timing controller 3020 generates a plurality of scanning control signals GCS and a plurality of data control signals DCS using synchronization signals (e.g., a dot clock DCLK, a data enable signal DE, a horizontal synchronization signal Hsync, and a vertical synchronization signal Vsync) input from the outside of the display device 30. The timing controller 3020 provides the scanning control signals GCS and the data control signals DCS, which are generated, to the gate driver 3010 and the data driver 3030, respectively, to control the gate driver 3010 and the data driver 3030.

The display device 30 may also include other components, such as a signal decoding circuit, a voltage conversion circuit, etc. These components may, for example, adopt existing conventional components, and will not be described in detail herein.

For example, the display device 30 may be any product or component having a display function such as a liquid crystal panel, a liquid crystal television, a display, an OLED panel, an OLED television, an OLED display, an electronic paper display device, a mobile phone, a tablet computer, a notebook computer, a digital photo frame, a navigator, and the like, and the embodiments of the present disclosure are not limited thereto.

At least some embodiments of the present disclosure also provide a drive method of a shift register unit, and the drive method can be used to drive the shift register unit provided by any one of embodiments of the present disclosure.

Figure 12:
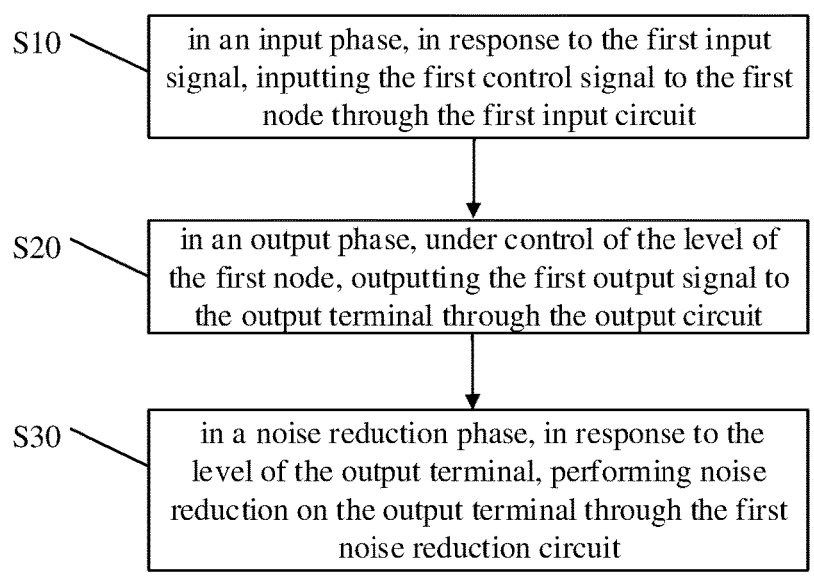
FIG. 12 is a flow chart of a drive method of a shift register unit according to some embodiments of the present disclosure.

FIG. 12 is a flow chart of a drive method of a shift register unit according to some embodiments of the present disclosure. For example, as shown in FIG. 12, the drive method of the shift register unit may include:

S10: in an input phase, in response to the first input signal, inputting the first control signal to the first node through the first input circuit;

S20: in an output phase, under control of the level of the first node, outputting the first output signal to the output terminal through the output circuit; and S30: in a noise reduction phase, in response to the level of the output terminal, performing noise reduction on the output terminal through the first noise reduction circuit.

For example, the above-mentioned steps S10 to S30 are all performed in a display phase of one frame.

For example, in another example, in a case where the shift register unit 10 includes the third control circuit 630, step S10 further includes: in response to the fourth control signal, controlling the level of the second node QB through the third control circuit 630, to pull down the level of the second node QB to a non-operation potential.

For example, in another example, in a case where the shift register unit 10 includes the second input circuit 400, the drive method of the shift register unit 10 further includes:

S40: in a blanking input phase, in response to the second input signal, inputting a second control signal to the first node through the second input circuit;

S50: in a blanking output phase, under control of the level of the first node, outputting the second output signal to the output terminal through the output circuit;

S60: in a blanking noise reduction phase, in response to the level of the output terminal, performing noise reduction on the output terminal through the first noise reduction circuit.

For example, the above steps S40 to S60 are all performed in a blanking phase of one frame.

For example, in another example, in a case where the shift register unit 10 includes the second control circuit 620, step S40 further includes: in response to the third control signal, controlling the level of the second node QB through the second control circuit 620, to pull down the level of the second node QB to a non-operation potential.

It should be noted that the detailed descriptions and the technical effects of the drive method can refer to the corresponding descriptions of the shift register unit 10 and the gate drive circuit 20 in the embodiments of the present disclosure, and are not repeated here again.

For the present disclosure, the following points need to be explained:

(1) The accompanying drawings of the embodiments of the present disclosure only involve structures related to the embodiments of the present disclosure, and other structures can refer to usual designs.

(2) In case of no conflict, the embodiments of the present disclosure and the features in the embodiments of the present disclosure can be combined with each other to obtain new embodiments.

What have been described above merely are exemplary embodiments of the present disclosure, the protection scope of the present disclosure is not limited thereto, and the protection scope of the present disclosure should be based on the protection scope of the claims.

What is claimed is:

1. A shift register unit, comprising a first noise reduction circuit, a first input circuit, and an output circuit,
    wherein the first input circuit is coupled to a first node, and is configured to input a first control signal to the first node in response to a first input signal;
    the output circuit is coupled to the first node and an output terminal, and is configured to output a first output signal to the output terminal under control of a level of the first node; and
    the first noise reduction circuit is coupled to the output terminal, and is configured to perform noise reduction on the output terminal in response to a level of the output terminal,
    the shift register unit further comprises a second control circuit and a third control circuit,
    wherein the second control circuit is coupled to a second node, and is configured to control a level of the second node in response to a third control signal; and
    the third control circuit is coupled to the second node, and is configured to control the level of the second node in response to a fourth control signal.

2. The shift register unit according to claim 1, wherein the first noise reduction circuit comprises a first noise reduction transistor, and the output terminal comprises a first signal output terminal,
    a gate electrode of the first noise reduction transistor and a first electrode of the first noise reduction transistor are both coupled to the first signal output terminal, a second electrode of the first noise reduction transistor is coupled to the first node to receive a level signal of the first node, and the first noise reduction transistor is configured to, in response to a level of the first signal output terminal, perform noise reduction on the first signal output terminal using the level signal of the first node; or
    the gate electrode of the first noise reduction transistor and the first electrode of the first noise reduction transistor are both coupled to the first signal output terminal, the second electrode of the first noise reduction transistor is coupled to an output clock signal terminal to receive an output clock signal, and the first noise reduction transistor is configured to, in response to a level of the first signal output terminal, perform noise reduction on the first signal output terminal using the output clock signal.

3. The shift register unit according to claim 2, wherein the output circuit further comprises a first output transistor;
    a gate electrode of the first output transistor is coupled to the first node, a first electrode of the first output transistor is configured to be coupled to the output clock signal terminal to receive the output clock signal, and a second electrode of the first output transistor is coupled to the first signal output terminal; and
    the output clock signal is transmitted to the first signal output terminal via the first output transistor and serves as a first sub-output signal, and the first output signal comprises the first sub-output signal.

4. The shift register unit according to claim 2, wherein the first noise reduction circuit further comprises a second noise reduction transistor, and the output terminal further comprises a second signal output terminal,
    a gate electrode of the second noise reduction transistor and a first electrode of the second noise reduction transistor are both coupled to the second signal output terminal, a second electrode of the second noise reduction transistor is coupled to the first node to receive the level signal of the first node, and the second noise reduction transistor is configured to, in response to a level of the second signal output terminal, perform noise reduction on the second signal output terminal using the level signal of the first node; or
    the gate electrode of the second noise reduction transistor and the first electrode of the second noise reduction transistor are both coupled to the second signal output terminal, the second electrode of the second noise reduction transistor is coupled to the output clock signal terminal to receive the output clock signal, and the second noise reduction transistor is configured to, in response to the level of the second signal output terminal, perform noise reduction on the second signal output terminal using the output clock signal.

5. The shift register unit according to claim 4, wherein the output circuit further comprises a second output transistor and a first capacitor, a gate electrode of the second output transistor is coupled to the first node, a first electrode of the second output transistor is configured to be coupled to the output clock signal terminal to receive the output clock signal, and a second electrode of the second output transistor is coupled to the second signal output terminal;

a first electrode of the first capacitor is configured to be coupled to the first node, and a second electrode of the first capacitor is configured to be coupled to the second electrode of the second output transistor; and the output clock signal is transmitted to the second signal output terminal via the second output transistor and serves as a second sub-output signal, and the first output signal comprises the second sub-output signal.

6. The shift register unit according to claim 1, further comprising a second input circuit, wherein the second input circuit is coupled to the first node, and is configured to input a second control signal to the first node according to a second input signal; and the output circuit is further configured to output a second output signal to the output terminal under control of the level of the first node.

7. The shift register unit according to claim 6, wherein the second input circuit comprises a charging sub-circuit, a storage sub-circuit, and an isolation sub-circuit, the charging sub-circuit is coupled to a control node, and is configured to input the second input signal to the control node in response to a second clock signal;

the storage sub-circuit is coupled to the control node, and is configured to store the second input signal input by the charging sub-circuit; and the isolation sub-circuit is coupled to the control node and the first node, and is configured to input the second control signal to the first node under control of a level of the control node and a first clock signal.

8. The shift register unit according to claim 1, wherein the first input circuit comprises a first transistor, a gate electrode of the first transistor is configured to be coupled to a first input signal terminal to receive the first input signal, a first electrode of the first transistor is configured to be coupled to a second voltage terminal to receive a second voltage, the first control signal comprises the second voltage, and a second electrode of the first transistor is configured to be coupled to the first node.

9. The shift register unit according to claim 1, further comprising a second noise reduction circuit, wherein the second noise reduction circuit is coupled to the first node, the second node, and the output terminal, and is configured to simultaneously perform noise reduction on the first node and the output terminal under control of the level of the second node.

10. The shift register unit according to claim 9, wherein the output circuit comprises a first signal output terminal and a second signal output terminal, and the second noise reduction circuit comprises a second transistor, a third transistor, and a fourth transistor;

a gate electrode of the second transistor is coupled to the second node, a first electrode of the second transistor is coupled to the first node, and a second electrode of the second transistor is configured to be coupled to a first voltage terminal to receive a first voltage;

a gate electrode of the third transistor is coupled to the second node, a first electrode of the third transistor is coupled to the first signal output terminal, and a second electrode of the third transistor is configured to be coupled to a third voltage terminal to receive a third voltage; and a gate electrode of the fourth transistor is coupled to the second node, a first electrode of the fourth transistor is coupled to the second signal output terminal, and a second electrode of the fourth transistor is configured to be coupled to the first voltage terminal to receive the first voltage.

11. The shift register unit according to claim 1, further comprising a first control circuit, wherein the first control circuit is coupled to the first node and the second node, and is configured to control the level of the second node under control of the level of the first node.

12. The shift register unit according to claim 1, further comprising a first reset circuit, wherein the first reset circuit is coupled to the first node, and is configured to reset the first node in response to a first reset control signal.

13. The shift register unit according to claim 1, further comprising a second reset circuit, wherein the second reset circuit is coupled to the first node, and is configured to reset the first node in response to a second reset control signal.

14. The shift register unit according to claim 1, further comprising a second input circuit, a second noise reduction circuit, a first control circuit, a first reset circuit, and a second reset circuit, wherein the first input circuit comprises a first transistor, a gate electrode of the first transistor is configured to be coupled to a first input signal terminal to receive the first input signal, a first electrode of the first transistor is configured to be coupled to a second voltage terminal to receive a second voltage, the first control signal comprises the second voltage, and a second electrode of the first transistor is coupled to the first node;

the second noise reduction circuit comprises a second transistor, a third transistor, and a fourth transistor, the output circuit comprises a first signal output terminal and a second signal output terminal, a gate electrode of the second transistor is coupled to the second node, a first electrode of the second transistor is coupled to the first node, and a second electrode of the second transistor is configured to be coupled to a first voltage terminal to receive a first voltage;

a gate electrode of the third transistor is coupled to the second node, a first electrode of the third transistor is coupled to the first signal output terminal, and a second electrode of the third transistor is configured to be coupled to a third voltage terminal to receive a third voltage; and a gate electrode of the fourth transistor is coupled to the second node, a first electrode of the fourth transistor is coupled to the second signal output terminal, and a second electrode of the fourth transistor is configured to be coupled to the first voltage terminal to receive the first voltage;

the second input circuit comprises a charging sub-circuit, a storage sub-circuit, and an isolation sub-circuit, the charging sub-circuit comprises a fifth transistor, a gate electrode of the fifth transistor is configured to receive a second clock signal, a first electrode of the fifth transistor is configured to receive a second input signal, a second electrode of the fifth transistor is coupled to a control node, the storage sub-circuit comprises a second capacitor, a first electrode of the second capacitor is coupled to the control node, a second electrode of the second capacitor is configured to be coupled to the first voltage terminal to receive the first voltage, the isolation sub-circuit comprises a sixth transistor and a seventh transistor, a gate electrode of the sixth transistor is coupled to the control node, a first electrode of the sixth transistor is configured to receive a second control signal, a second electrode of the sixth transistor is coupled to a first electrode of the seventh transistor, a gate electrode of the seventh transistor is configured to receive a first clock signal, and a second electrode of the seventh transistor is coupled to the first node;

the first control circuit comprises an eighth transistor, a ninth transistor, and a tenth transistor, a gate electrode of the eighth transistor is coupled to a first electrode of the eighth transistor, and is configured to be coupled to a fourth voltage terminal to receive a fourth voltage, and a second electrode of the eighth transistor is coupled to the second node, a gate electrode of the ninth transistor is coupled to a first electrode of the ninth transistor, and is configured to be coupled to a fifth voltage terminal to receive a fifth voltage, and a second electrode of the ninth transistor is coupled to the second node;

a gate electrode of the tenth transistor is coupled to the first node, a first electrode of the tenth transistor is coupled to the second node, and a second electrode of the tenth transistor is configured to be coupled to the first voltage terminal to receive the first voltage;

the first reset circuit comprises an eleventh transistor, a gate electrode of the eleventh transistor is configured to receive a first reset control signal, a first electrode of the eleventh transistor is coupled to the first node, and a second electrode of the eleventh transistor is configured to be coupled to the first voltage terminal to receive the first voltage;

the second reset circuit comprises a twelfth transistor, a gate electrode of the twelfth transistor is configured to receive a second reset control signal, a first electrode of the twelfth transistor is coupled to the first node, and a second electrode of the twelfth transistor is configured to be coupled to the first voltage terminal to receive the first voltage;

the second control circuit comprises a fourteenth transistor, a gate electrode of the fourteenth transistor is configured to receive the third control signal, a first electrode of the fourteenth transistor is coupled to the second node, and a second electrode of the fourteenth transistor is configured to be coupled to the first voltage terminal to receive the first voltage; and the third control circuit comprises a sixteenth transistor, a gate electrode of the sixteenth transistor is configured to receive the fourth control signal, a first electrode of the sixteenth transistor is coupled to the second node, and a second electrode of the sixteenth transistor is configured to be coupled to the first voltage terminal to receive the first voltage.

15. A gate drive circuit, comprising a plurality of shift register units, wherein the plurality of shift register units are cascaded, and each of the plurality of shift register units is the shift register unit according to claim 1.

16. The gate drive circuit according to claim 15, further comprising a first sub-clock signal line, a second sub-clock signal line, a third sub-clock signal line, and a fourth sub-clock signal line, wherein an output clock signal terminal of a (4n−3)-th stage shift register unit of the plurality of shift register units is coupled to the first sub-clock signal line;

an output clock signal terminal of a (4n−2)-th stage shift register unit of the plurality of shift register units is coupled to the second sub-clock signal line;

an output clock signal terminal of a (4n−1)-th stage shift register unit of the plurality of shift register units is coupled to the third sub-clock signal line;

an output clock signal terminal of a (4n)-th stage shift register unit of the plurality of shift register units is coupled to the fourth sub-clock signal line; and n is an integer greater than 0.

17. The gate drive circuit according to claim 15, wherein a first input signal terminal of an (m+2)-th stage shift register unit of the plurality of shift register units is coupled to a second signal output terminal of an (m)-th stage shift register unit of the plurality of shift register units, a second input signal terminal of an (m+1)-th stage shift register unit of the plurality of shift register units is coupled to the second signal output terminal of the (m)-th stage shift register unit of the plurality of shift register units, and m is an integer greater than 0.

18. A display device, comprising the gate drive circuit according to claim 15.

19. A drive method of a shift register unit, wherein the shift register unit comprises a first noise reduction circuit, a first input circuit, and an output circuit, the first input circuit is coupled to a first node, and is configured to input a first control signal to the first node in response to a first input signal;

the output circuit is coupled to the first node and an output terminal, and is configured to output a first output signal to the output terminal under control of a level of the first node; and the first noise reduction circuit is coupled to the output terminal, and is configured to perform noise reduction on the output terminal in response to a level of the output terminal, the shift register unit further comprises a second control circuit and a third control circuit, wherein the second control circuit is coupled to a second node, and is configured to control a level of the second node in response to a third control signal; and the third control circuit is coupled to the second node, and is configured to control the level of the second node in response to a fourth control signal, the drive method of the shift register unit comprises:

in an input phase, in response to the first input signal, inputting the first control signal to the first node through the first input circuit;

in an output phase, under control of the level of the first node, outputting the first output signal to the output terminal through the output circuit; and in a noise reduction phase, in response to the level of the output terminal, performing noise reduction on the output terminal through the first noise reduction circuit.

20. A shift register unit, comprising a first noise reduction circuit, a first input circuit, and an output circuit, wherein the first input circuit is coupled to a first node, and is configured to input a first control signal to the first node in response to a first input signal;

the output circuit is coupled to the first node and an output terminal, and is configured to output a first output signal to the output terminal under control of a level of the first node; and the first noise reduction circuit is coupled to the output terminal, and is configured to perform noise reduction on the output terminal in response to a level of the output terminal;

wherein the first noise reduction circuit comprises a first noise reduction transistor, and the output terminal comprises a first signal output terminal, a gate electrode of the first noise reduction transistor and a first electrode of the first noise reduction transistor are both coupled to the first signal output terminal, a second electrode of the first noise reduction transistor is coupled to the first node to receive a level signal of the first node, and the first noise reduction transistor is configured to, in response to a level of the first signal output terminal, perform noise reduction on the first signal output terminal using the level signal of the first node; or the gate electrode of the first noise reduction transistor and the first electrode of the first noise reduction transistor are both coupled to the first signal output terminal, the second electrode of the first noise reduction transistor is coupled to an output clock signal terminal to receive an output clock signal, and the first noise reduction transistor is configured to, in response to the level of the first signal output terminal, perform noise reduction on the first signal output terminal using the output clock signal;

the first noise reduction circuit further comprises a second noise reduction transistor, and the output terminal further comprises a second signal output terminal, a gate electrode of the second noise reduction transistor and a first electrode of the second noise reduction transistor are both coupled to the second signal output terminal, a second electrode of the second noise reduction transistor is coupled to the first node to receive the level signal of the first node, and the second noise reduction transistor is configured to, in response to a level of the second signal output terminal, perform noise reduction on the second signal output terminal using the level signal of the first node; or the gate electrode of the second noise reduction transistor and the first electrode of the second noise reduction transistor are both coupled to the second signal output terminal, the second electrode of the second noise reduction transistor is coupled to the output clock signal terminal to receive the output clock signal, and the second noise reduction transistor is configured to, in response to the level of the second signal output terminal, perform noise reduction on the second signal output terminal using the output clock signal.

\* \* \* \* \*